(12) United States Patent
Liu et al.

(10) Patent No.: US 11,133,260 B2
(45) Date of Patent: Sep. 28, 2021

(54) SELF-ALIGNED TOP VIA

(71) Applicant: INTERNATIONAL BUSINESS MACHINES CORPORATION, Armonk, NY (US)

(72) Inventors: Chi-Chun Liu, Altamont, NY (US); John C. Arnold, North Chatham, NY (US); Dominik Metzler, Saratoga Springs, NY (US); Nelson Felix, Slingerlands, NY (US); Ashim Dutta, Menands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 16/685,192

(22) Filed: Nov. 15, 2019

(65) Prior Publication Data

US 2021/0151377 A1    May 20, 2021

(51) Int. Cl.
| | |
|---|---|
| *H01L 21/302* | (2006.01) |
| *H01L 23/538* | (2006.01) |
| *H01L 21/768* | (2006.01) |
| *H01L 21/762* | (2006.01) |
| *H01L 21/033* | (2006.01) |
| *H01L 21/3213* | (2006.01) |

(52) U.S. Cl.
CPC ...... *H01L 23/5384* (2013.01); *H01L 21/0332* (2013.01); *H01L 21/32139* (2013.01); *H01L 21/76224* (2013.01); *H01L 21/76897* (2013.01)

(58) Field of Classification Search
None
See application file for complete search history.

(56) References Cited

U.S. PATENT DOCUMENTS

| | | | |
|---|---|---|---|
| 8,357,609 B2 | 1/2013 | Ryan | |
| 8,361,704 B2 | 1/2013 | Colburn et al. | |
| 9,418,935 B1 | 8/2016 | Shao et al. | |
| 9,502,350 B1 | 11/2016 | Bonilla et al. | |
| 9,601,426 B1 | 3/2017 | Bonilla et al. | |
| 9,934,970 B1* | 4/2018 | Burns | H01L 21/0337 |
| 10,020,223 B1 | 7/2018 | Anderson et al. | |
| 10,177,031 B2 | 1/2019 | Bao et al. | |
| 10,685,874 B1* | 6/2020 | Xie | H01L 21/76832 |
| 2015/0056800 A1 | 2/2015 | Mebarki et al. | |
| 2017/0162437 A1 | 6/2017 | Rubin et al. | |
| 2018/0233404 A1* | 8/2018 | Shu | H01L 21/76802 |
| 2019/0035677 A1 | 1/2019 | Chandhok et al. | |
| 2021/0090889 A1* | 3/2021 | Cheng | H01L 21/3115 |

* cited by examiner

*Primary Examiner* — Ali Naraghi
(74) *Attorney, Agent, or Firm* — Tutunjian & Bitetto, P.C.; Abdy Raissinia

(57) ABSTRACT

A method of forming a self-aligned top via is provided. The method includes forming a metallization layer on a substrate, and forming a hardmask layer on the metallization layer. The method further includes forming a pair of adjacent parallel mandrels on the hardmask layer with sidewall spacers on opposite sides of each mandrel. The method further includes forming a planarization layer on the exposed portions of the hardmask layer, mandrels, and sidewall spacers, and forming an opening in the planarization layer aligned between the adjacent parallel mandrels. The method further includes forming a spacer layer in the opening, and removing portions of the spacer layer to form a pair of spacer plugs between sections of the sidewall spacers.

16 Claims, 18 Drawing Sheets

SELF-ALIGNED TOP VIA

BACKGROUND

The present invention generally relates to the formation of top vias, and more particularly to fully aligned top vias.

Semiconductor device on a semiconductor chip are electrically connected to the packaging connections using multiple metallization layers. Vias can interconnect different metallization layers, where some vias can skip an intervening metallization layer to be a skip via or super via. Metallization layers can be referred to as, M1, M2, M3, etc., whereas via levels can be referred to as V1, V2, V3, etc. Alignment of vias and metal lines on different levels can suffer from overlay tolerances.

SUMMARY

In accordance with an embodiment of the present invention, a method of forming a self-aligned top via is provided. The method includes forming a metallization layer on a substrate, and forming a hardmask layer on the metallization layer. The method further includes forming a pair of adjacent parallel mandrels on the hardmask layer with sidewall spacers on opposite sides of each mandrel. The method further includes forming a planarization layer on the exposed portions of the hardmask layer, mandrels, and sidewall spacers, and forming an opening in the planarization layer aligned between the adjacent parallel mandrels. The method further includes forming a spacer layer in the opening, and removing portions of the spacer layer to form a pair of spacer plugs between sections of the sidewall spacers.

In accordance with another embodiment of the present invention, a method of forming a self-aligned top via is provided. The method includes forming a hardmask layer on the metallization layer over a substrate. The method further includes forming a pair of adjacent parallel mandrels on the hardmask layer with sidewall spacers on opposite sides of each mandrel, and forming a planarization layer on the exposed portions of the hardmask layer, mandrels, and sidewall spacers. The method further includes forming an opening in the planarization layer aligned between the adjacent parallel mandrels, and forming a spacer layer in the opening. The method further includes removing portions of the spacer layer to form a pair of spacer plugs between sections of the sidewall spacers, and forming a fill layer in the opening over and between the pair of spacer plugs.

In accordance with yet another embodiment of the present invention, an integral self-aligned top via is provided. The integral self-aligned top via includes a metal line on a substrate, and a via integral on top of and with the metal line, wherein the integral self-aligned via shares common sidewalls and a common end wall with the underlying metal line.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide sub-30 nanometer (nm) pitch self-aligned vias at metal line ends that avoid partial metal line-to-via contact. The top vias can be positioned at the end of metal lines in underlying metallization layers by a subtractive process that forms the via and line cut at the same time.

Embodiments of the present invention provide a method of forming metal lines and vias using mandrels and sidewall spacers to form spacers that define vias self-aligned at the metal line ends. The spacers can act as masks to define both vias and metal line cuts as part of the same process step.

Exemplary applications/uses to which the present invention can be applied include, but are not limited to: logic devices (e.g., transistors, NAND gates, NOR gates, flip-flops, etc.), memory devices (e.g., SRAM, DRAM, MRAM, etc.), and other back-end-of-line structures that electrically connect analog and/or digital devices.

It is to be understood that aspects of the present invention will be described in terms of a given illustrative architecture; however, other architectures, structures, substrate materials and process features and steps can be varied within the scope of aspects of the present invention.

Figure 1:
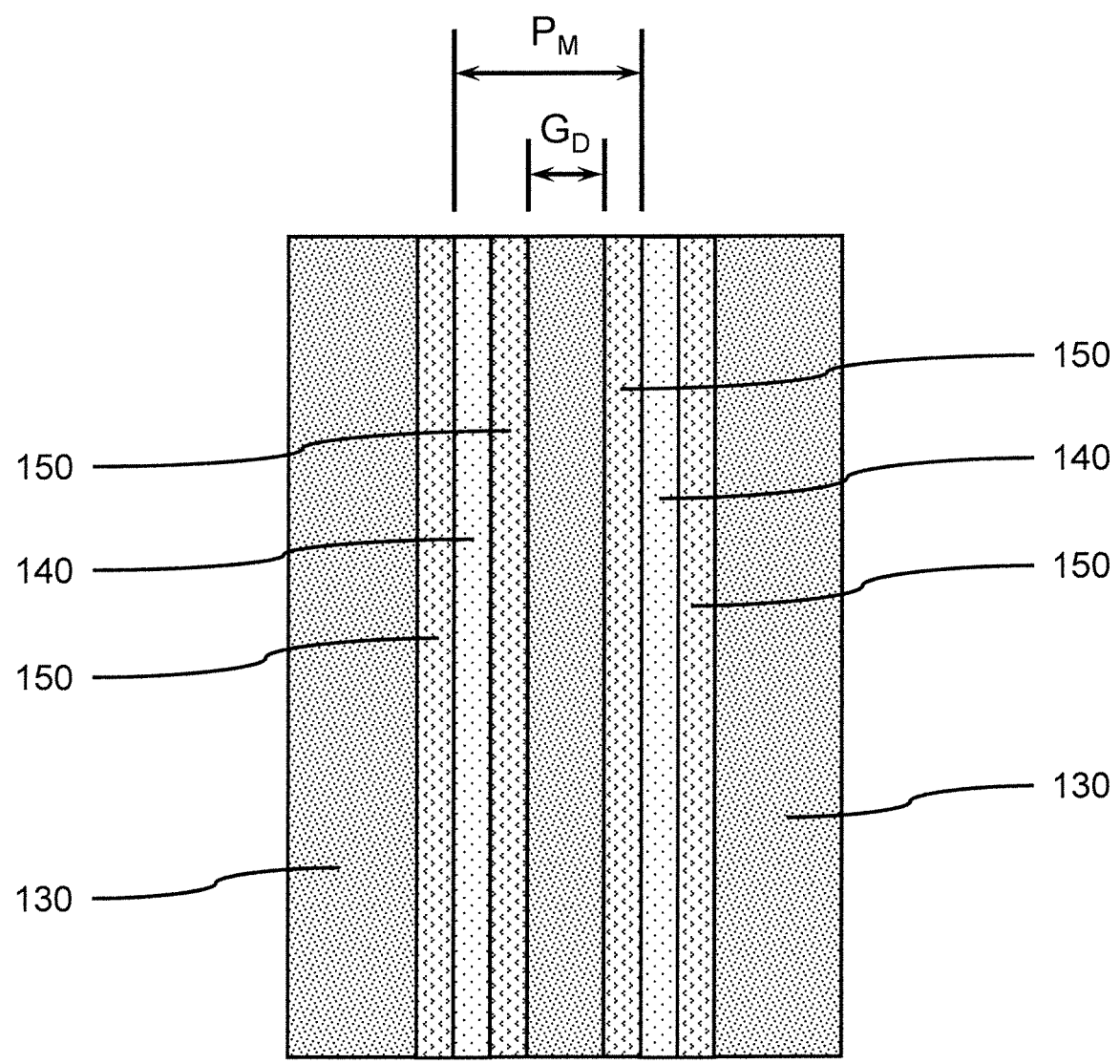
FIG. 1 is a top view showing a pair of parallel mandrels and sidewall spacers on a substrate, in accordance with an embodiment of the present invention.

Referring now to the drawings in which like numerals represent the same or similar elements and initially to FIG. 1, a top view of a pair of parallel mandrels and sidewall spacers on a substrate is shown, in accordance with an embodiment of the present invention.

In one or more embodiments, a plurality of mandrels 140 can be formed on a hardmask layer 130 on a substrate. Sidewall spacers 150 can be formed on opposite sides of each of the plurality of mandrels 140, where the sidewall spacers can be in contact with the sidewalls of the mandrel 140. The arrangement of sidewall spacers 150 and the associated mandrel 140 can be essentially parallel with adjacent sidewall spacers 150 and the associated mandrel 140. A pair of adjacent parallel mandrels 140 can be formed with sidewall spacers 150 on opposite sides of each mandrel 140. The closest sidewall spacers 150 on the adjacent mandrels 140 can be separated by a gap distance, $D_G$, in a range of about 5 nm to about 15 nm, or about 9 nm to about 12 nm, although other gap distances are also contemplated.

In various embodiments, the mandrels 140 can have a pitch, $P_M$, in a range of about 28 nanometers (nm) to about 60 nm, or about 36 nm to about 48 nm, although other pitches are also contemplated.

In various embodiments, the mandrels 140 can have a width in a range of about 5 nanometers (nm) to about 15 nm, or about 9 nm to about 12 nm, although other widths are also contemplated.

In various embodiments, the mandrels 140 can be a selectively etchable material that can be removed relative to surrounding materials. The mandrels 140 can be, for example, amorphous silicon (a-Si), poly-crystalline silicon (p-Si), amorphous silicon-germanium (a-SiGe), polycrystalline silicon-germanium (p-SiGe), amorphous carbon (a-C), silicon nitride (SiN), or combinations thereof.

In various embodiments, the sidewall spacers 150 can have a width in a range of about 7 nm to about 15 nm, or about 9 nm to about 12 nm, although other widths are also contemplated.

In various embodiments, the sidewall spacers 150 can be a dielectric material, including, but not limited to, silicon oxide (SiO), silicon nitride (SiN), silicon oxynitride (SiON), silicon oxycarbide (SiOC), or metal compounds, including oxides and nitrides, for example, titanium oxide (TiO), titanium nitride (TiN), tantalum nitride (TaN), or combinations thereof.

Figure 2:
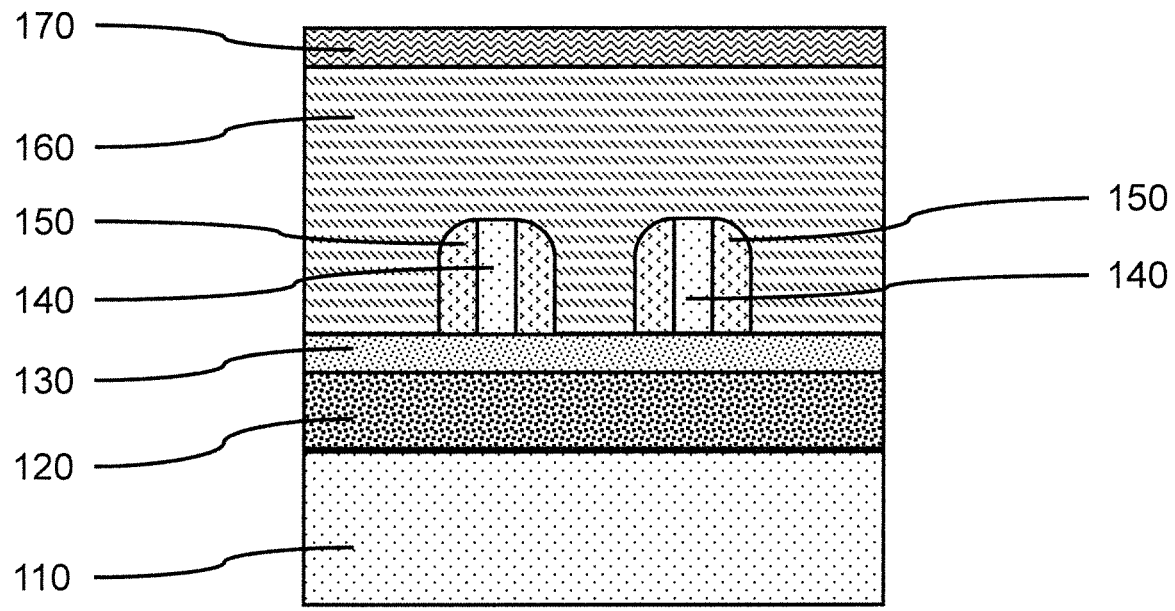
FIG. 2 is a cross-sectional side view showing a planarization layer on the pair of parallel mandrels and sidewall spacers, and an anti-reflection coating layer on the planarization layer, in accordance with an embodiment of the present invention.

FIG. 2 is a cross-sectional side view showing a planarization layer on the pair of parallel mandrels and sidewall spacers, and an anti-reflection coating layer on the planarization layer, in accordance with an embodiment of the present invention.

In one or more embodiments, a substrate 110 can be a semiconductor or semiconductor on insulator (SeOI) substrate, where the semiconductor substrate can be a single crystal wafer. The substrate 110 can be made of a type IV semiconductor (e.g., silicon (Si), germanium (Ge)), a IV-IV compound semiconductor (e.g., silicon-germanium (SiGe), silicon carbide (SiC)) a III-V compound semiconductor (e.g., gallium arsenide (GaAs), indium phosphide (InP), etc.), or include combinations thereof.

In various embodiments, the substrate 110 can include previously fabricated electronic devices, including, but not limited to, active electronic devices (e.g., transistors, silicon controlled rectifiers, triacs), passive devices (e.g., resistors, capacitors, inductors), and combinations thereof. The substrate 110 can include an interlayer dielectric (ILD) layer over the previously fabricated electronic devices to provide electrical isolation.

In one or more embodiments, a metallization layer 120 can be formed on the substrate 110, where the metallization layer can be formed by a deposition, for example, atomic layer deposition (ALD), plasma enhanced atomic layer deposition (PEALD), chemical vapor deposition (CVD), metal-organic chemical vapor deposition (MOCVD), plasma enhanced chemical vapor deposition (PECVD), physical vapor deposition (PVD), plating, and combinations thereof. The metallization layer 120 can be formed on the ILD layer of the substrate 110.

In various embodiments, the metallization layer 120 can have a thickness in a range of about 10 nm to about 120 nm, or about 30 nm to about 70 nm, although other thicknesses are also contemplated.

In various embodiments, the metallization layer 120 can be a conductive material, including, but not limited to, copper (Cu), nickel (Ni), cobalt (Co), molybdenum (Mo), ruthenium (Ru), palladium (Pd), silver (Ag), gold (Au), aluminum (Al), an alloy, for example, cobalt-ruthenium alloy (CoRu), a metal compound, for example, titanium nitride (TiN), and combinations thereof. The metallization layer 120 can be a conductive material that can be subtractively etched to form vias and metal lines.

In one or more embodiments, a hardmask layer 130 can be formed on the metallization layer 120, where the hardmask layer 130 can be formed by a deposition process (e.g., ALD, PEALD, CVD, PECVD, MOCVD, PVD).

In various embodiments, the hardmask layer 130 can have a thickness in a range of about 5 nm to about 30 nm, or about 10 nm to about 20 nm, although other thicknesses are also contemplated.

In various embodiments, the hardmask layer 130 can be a hardmask material, including, but not limited to, titanium nitride (TiN), tantalum nitride (TaN), silicon oxide (SiO), silicon nitride (SiN), silicon oxynitride (SiON), silicon boro carbonitride (SiBCN), and combinations thereof.

In one or more embodiments, a plurality of mandrels 140 can be formed on the hardmask layer 130, where the mandrels 140 can be formed by patterning a mandrel layer using lithographic techniques and etching.

In one or more embodiments, sidewall spacers 150 can be formed on opposite sides of each of the mandrels 140, where the sidewall spacers 150 can be formed by a conformal deposition, for example, ALD, PEALD, or a combination thereof, and etching, for example, using a selective, directional etch (e.g., reactive ion etching (RIE)).

In one or more embodiments, a planarization layer 160 can be formed on the exposed portions of the hardmask layer 130, sidewall spacers 150, and mandrels 140, where the planarization layer 160 can be formed by spin coating, a blanket deposition (e.g., CVD, PECVD, PVD), and combinations thereof, that covers the sidewall spacers 150 and mandrels 140 on the hardmask layer 130.

In various embodiments, the planarization layer 160 can be an electrically insulating dielectric material, including, but not limited to, silicon oxide (SiO), low-k dielectric materials, and combinations thereof. The low-k dielectric materials can be carbon-doped silicon oxide (SiO:C), fluorine doped silicon oxide (SiO:F), carbon-based polymeric materials, silicon based polymeric dielectric materials, for example, hydrogen silsesquioxane (HSQ) and methylsilsesquioxane (MSQ), tetraethoxysilane (TEOS), and combinations thereof. In various embodiments, the planarization layer 160 can be a spin-on carbon or carbon-based polymeric materials, for example an organic planarization layer (OPL).

In one or more embodiments, an anti-reflection coating layer 170 can be formed on the planarization layer 160, where the anti-reflection coating layer can be formed by a spin coating or deposition (e.g., ALD, PEALD, CVD, PECVD, MOCVD, PVD).

In various embodiments, the anti-reflection coating layer 170 can be a Si-containing antireflection coating (SiARC), and/or a thin hard mask material layer plus a thin spin-on organic layer that can act as an adhesion promotor. The hardmask material can be titanium nitride (TiN), tantalum nitride (TaN), silicon oxide (SiO), silicon nitride (SiN), silicon oxynitride (SiON), silicon boro carbonitride (SiBCN), and combinations thereof.

Figure 3:
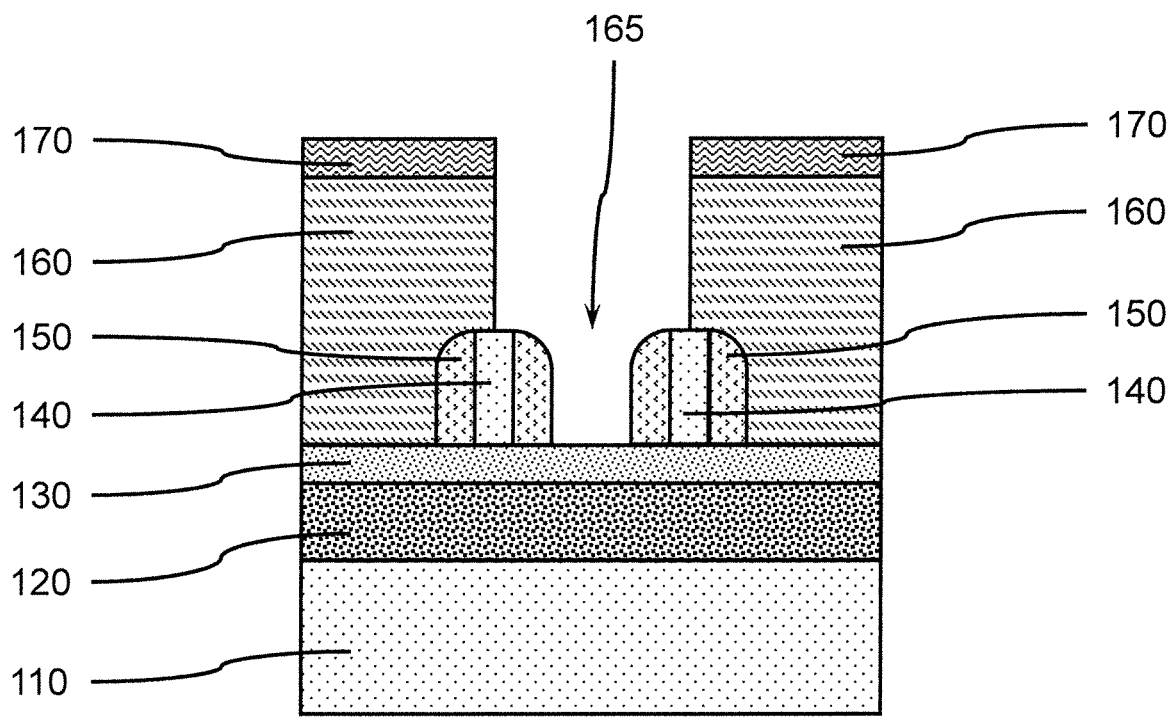
FIG. 3 is a cross-sectional side view showing an opening formed in the anti-reflection coating layer and the planarization layer between the pair of parallel mandrels and sidewall spacers, in accordance with an embodiment of the present invention.

FIG. 3 is a cross-sectional side view showing an opening formed in the anti-reflection coating layer and the planarization layer between the pair of parallel mandrels and sidewall spacers, in accordance with an embodiment of the present invention.

In one or more embodiments, an opening 165 can be formed in the anti-reflection coating layer 170 and planarization layer 160, where the opening 165 can be formed by masking and patterning the anti-reflection coating layer 170 using lithographic techniques, and removing the exposed portions of the anti-reflection coating layer 170 and underlying planarization layer 160. The opening 165 can expose portions of the hardmask layer 130, sidewall spacers 150, and mandrels 140, where the opening can be positioned over a portion of two adjacent sidewall spacers 150 and mandrels 140. The hardmask layer 130 can act as an etch-stop layer to allow one or more selective directional etches (e.g., RIE) to remove the exposed portion of the planarization layer 160 selectively relative to the exposed portions of mandrels 140 and sidewall spacers 150.

In various embodiments, the opening 165 can have a width in a range of about 10 nm to about 60 nm, or about 28 nm to about 48 nm, or about 35 nm to about 40 nm, although other widths are also contemplated. The width of the opening can be about the same as the pitch of the mandrels 140, so partial widths of sections of two adjacent mandrels 140 can be exposed by the opening 165, while the full widths of sections of the adjacent sidewall spacers 150 can be exposed by the opening 165. The one or more opening(s) 165 can be positioned between two adjacent mandrels 140, where a portion of the hardmask layer 130 can be exposed between the adjacent sidewall spacers 150.

Figure 4:
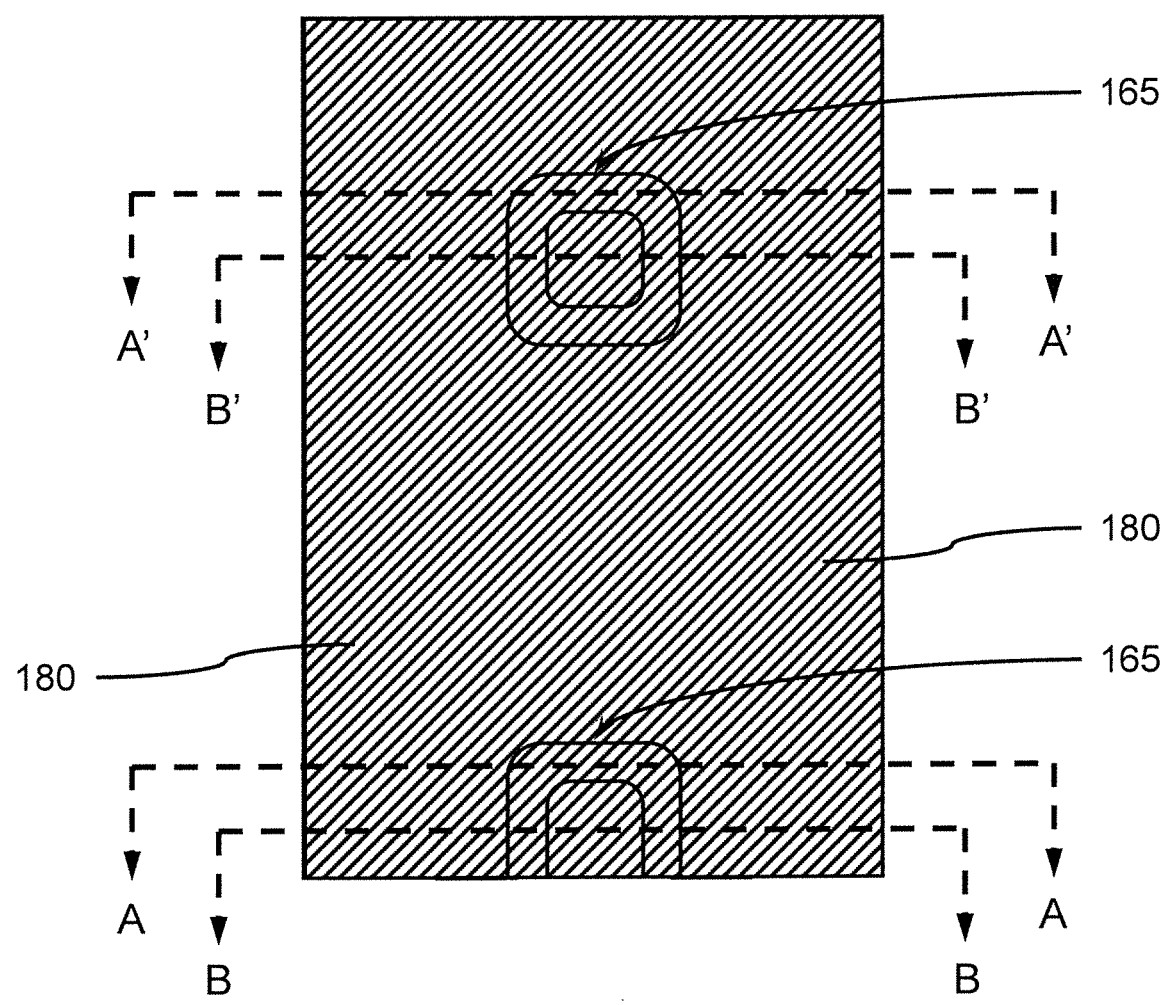
FIG. 4 is a top view showing a spacer layer formed on the anti-reflection coating layer and in a plurality of openings between the pair of parallel mandrels and sidewall spacers, in accordance with an embodiment of the present invention.

FIG. 4 is a top view showing a spacer layer formed on the anti-reflection coating layer and in a plurality of openings between the pair of parallel mandrels and sidewall spacers, in accordance with an embodiment of the present invention.

In one or more embodiments, a spacer layer 180 can be formed on the anti-reflection coating layer 170, where the spacer layer 180 can be formed by a conformal deposition (e.g., ALD, PEALD, combinations thereof), so the portion of the opening between the adjacent sidewall spacers 150 can be filled by the spacer layer 180 without forming a pinch-off and void space below the top surfaces of the mandrels 140 and sidewall spacers 150. The spacer layer 180 can be formed on the top surface of the anti-reflection coating layer 170 and the sidewalls of the planarization layer 160 forming the opening 165, such that two regions of spacer layer 180 is formed in the opening 165.

In various embodiments, the spacer layer 180 can be a hardmask material, including, but not limited to, titanium nitride (TiN), tantalum nitride (TaN), silicon nitride (SiN), silicon oxynitride (SiON), silicon boro carbonitride (SiBCN), and combinations thereof.

Figure 5:
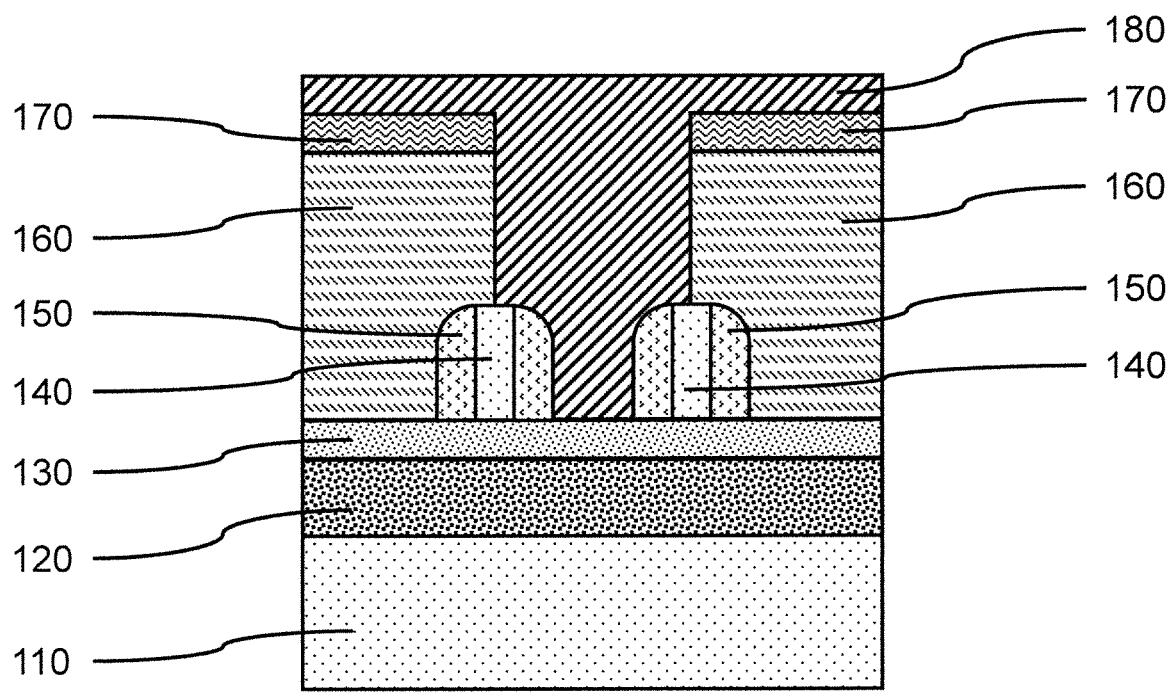
FIG. 5 is a cross-sectional side view along the A-A and A'-A' cross-sections of FIG. 4 showing the spacer layer in the opening and on the mandrels and sidewall spacers, in accordance with an embodiment of the present invention.

FIG. 5 is a cross-sectional side view along the A-A and A'-A' cross-sections of FIG. 4 showing the spacer layer in the opening and on the mandrels and sidewall spacers, in accordance with an embodiment of the present invention.

In one or more embodiments, the spacer layer 180 can cover the anti-reflection coating layer 170 and the sidewalls of the planarization layer 160 forming the opening 165, and fill in the region between the adjacent sidewall spacers 150.

Figure 6:
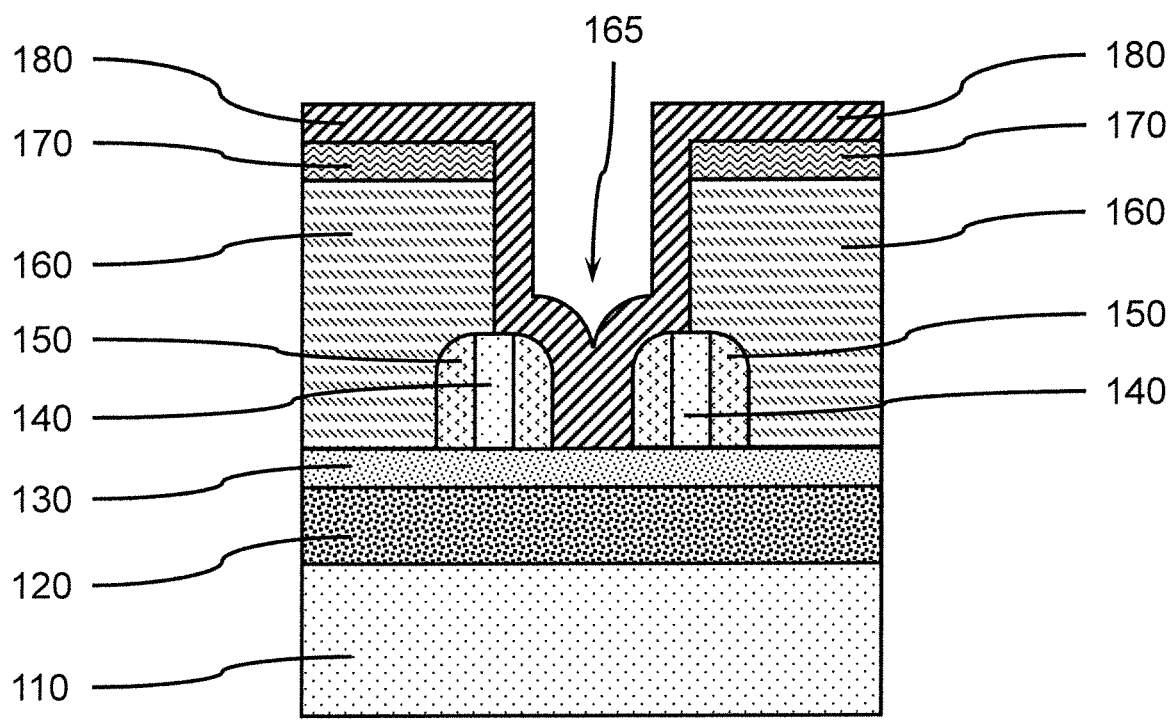
FIG. 6 is a cross-sectional side view along the B-B and B'-B' cross-sections of FIG. 4 showing the spacer layer on the sidewalls of the planarization layer, the mandrels, and sidewall spacers, with a void space within the center of the opening, in accordance with an embodiment of the present invention.

FIG. 6 is a cross-sectional side view along the B-B and B'-B' cross-sections of FIG. 4 showing the spacer layer on the sidewalls of the planarization layer, the mandrels, and sidewall spacers, with a void space within the center of the opening, in accordance with an embodiment of the present invention.

In one or more embodiments, the spacer layer 180 can cover the anti-reflection coating layer 170 and the sidewalls of the planarization layer 160 forming the opening 165, and fill in the region between the adjacent sidewall spacers 150, while leaving a central portion of the opening 165 unfilled by the spacer layer due to the conformal deposition.

In various embodiments, the size of a small opening 165 can be approximately the width of the gap distance, $D_G$, between the facing sidewall spacers 150 on different adjacent parallel mandrels, such that the spacer layer 180 fills in the entire opening without leaving a space between the spacer layer 180 on the sidewalls of the planarization layer 160.

Figure 7:
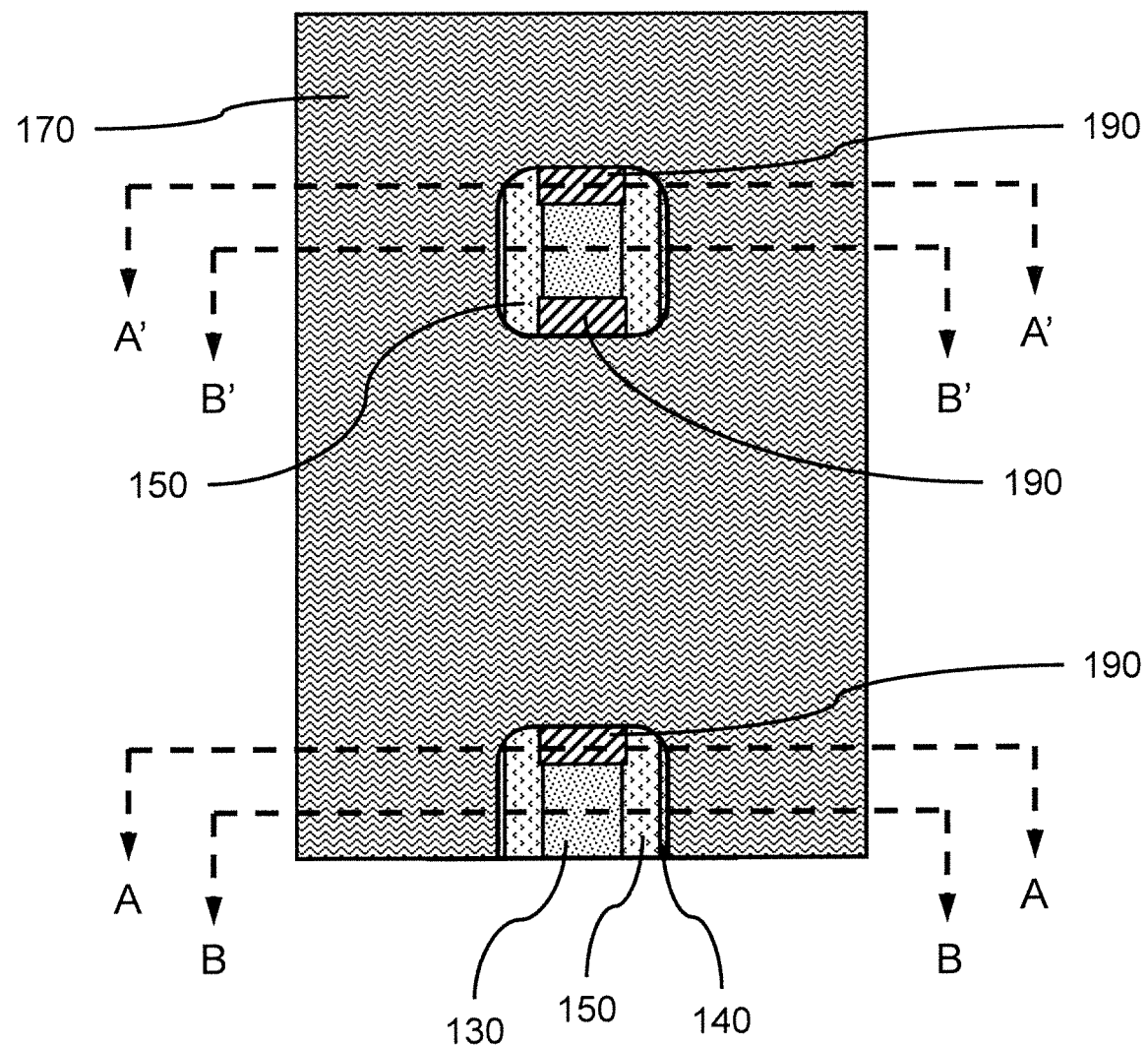
FIG. 7 is a top view showing the spacer layer removed from the anti-reflection coating layer and portions of the sidewalls of the planarization layer, the mandrels, and sidewall spacers to form spacer plugs between sections of the sidewall spacers, in accordance with an embodiment of the present invention.

FIG. 7 is a top view showing the spacer layer removed from the anti-reflection coating layer and portions of the sidewalls of the planarization layer, the mandrels, and sidewall spacers to form spacer plugs between sections of the sidewall spacers, in accordance with an embodiment of the present invention.

In one or more embodiments, portions of the spacer layer 180 can be removed from the anti-reflection coating layer 170, and portions of the sidewalls of the planarization layer 160, the mandrels 140, and sidewall spacers 150, to form spacer plugs 190 between sections of the sidewall spacers 150. The portions of the spacer layer 180 can be removed using a selective, directional etch (e.g., RIE), where the different vertical thicknesses of the spacer layer 180 along the sidewalls of the planarization layer 160 and central portion of the opening 165 allows essentially all of the spacer layer 180 can be removed from the sidewalls of the planarization layer 160 and central portion of the opening 165, while leaving spacer plugs 190 on opposite sides of the opening between the adjacent sidewall spacers 150. Removing portions of the planarization layer can thereby form a pair of spacer plugs between sections of the sidewall spacers 150. When the opening is approximately the size of the gap distance, $D_G$, the two spacer plugs 190 on opposite sides of the opening can merge into a single spacer plug 190 that can be used to form a single via along the interior of a metal line rather than at an end.

Figure 8:
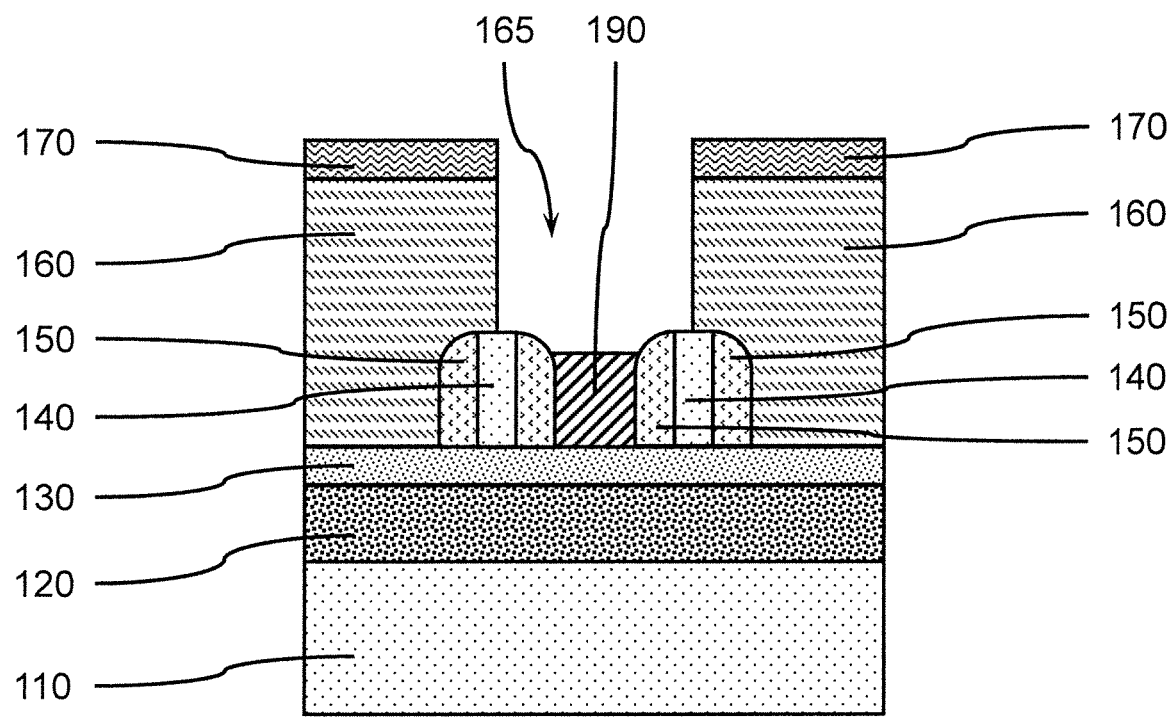
FIG. 8 is a cross-sectional side view along the A-A and A'-A' cross-sections of FIG. 7 showing a remaining portion of the spacer layer in the opening forming a spacer plug between sidewall spacers, in accordance with an embodiment of the present invention.

FIG. 8 is a cross-sectional side view along the A-A and A'-A' cross-sections of FIG. 7 showing a remaining portion of the spacer layer in the opening forming a spacer plug between sidewall spacers, in accordance with an embodiment of the present invention.

In one or more embodiments, after removing portions of the spacer layer 180, the spacer plugs 190 can be in a lower portion of the opening(s) 165 between the adjacent sidewall spacers 150. The top surface of the spacer plugs 190 can be below the top surfaces of the sidewall spacers 150 and mandrels 140 due to the directional etching. The spacer plugs 190 can also have curved surfaces (into and out of the plane of the figure) from the shape of the deposited spacer layer 180 and directional etch. The width of the spacer plugs 190 can be greater at the top of the spacer plugs 190 than at the bottom due to the curved shape of the adjacent sidewall spacers 150.

Figure 9:
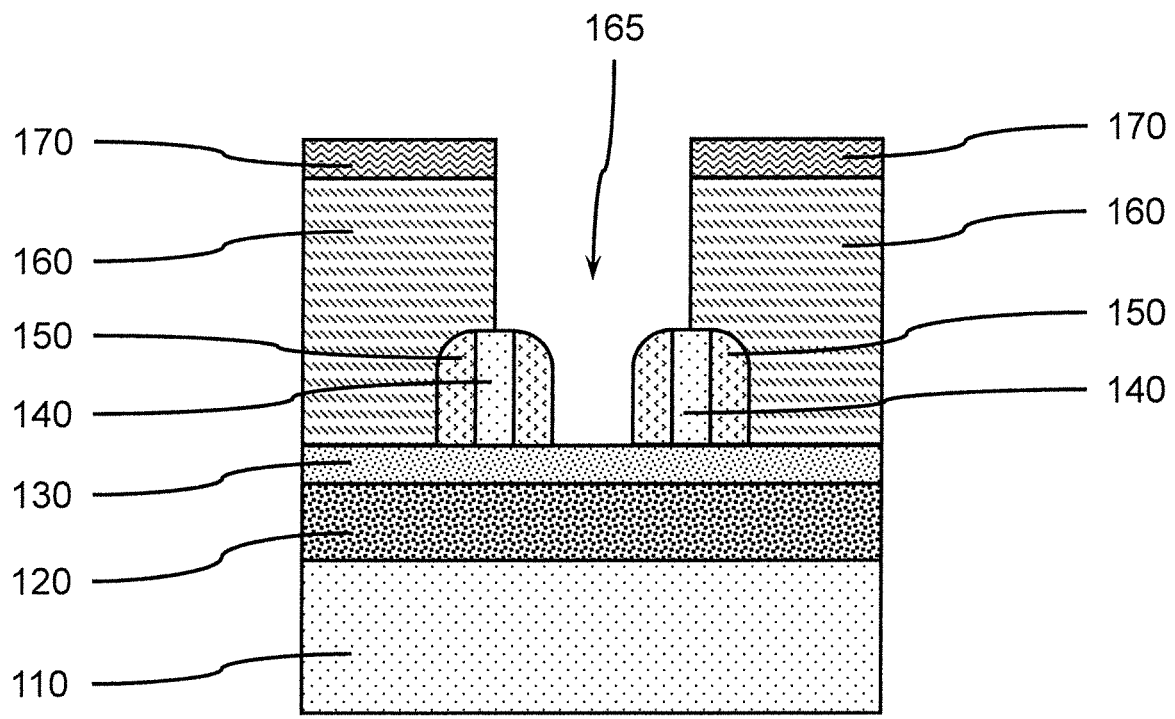
FIG. 9 is a cross-sectional side view along the B-B and B'-B' cross-sections of FIG. 7 showing the spacer layer removed from the sidewalls of the opening in the planarization layer, the mandrels, and sidewall spacers, in accordance with an embodiment of the present invention.

FIG. 9 is a cross-sectional side view along the B-B and B'-B' cross-sections of FIG. 7 showing the spacer layer removed from the sidewalls of the opening in the planarization layer, the mandrels, and sidewall spacers, in accordance with an embodiment of the present invention.

In one or more embodiments, the sections of the sidewall spacers 150 can be exposed within the center of the opening 165 by removing the portions of the spacer layer 180 on the hardmask layer 130, sidewalls of the planarization layer 160, and the sidewall spacers 150. The hardmask layer 130 can be exposed in the center of the opening 165 between the sidewall spacers 150. With a small opening 165, a single spacer plug 190 can remain between sidewall spacers 150.

Figure 10:
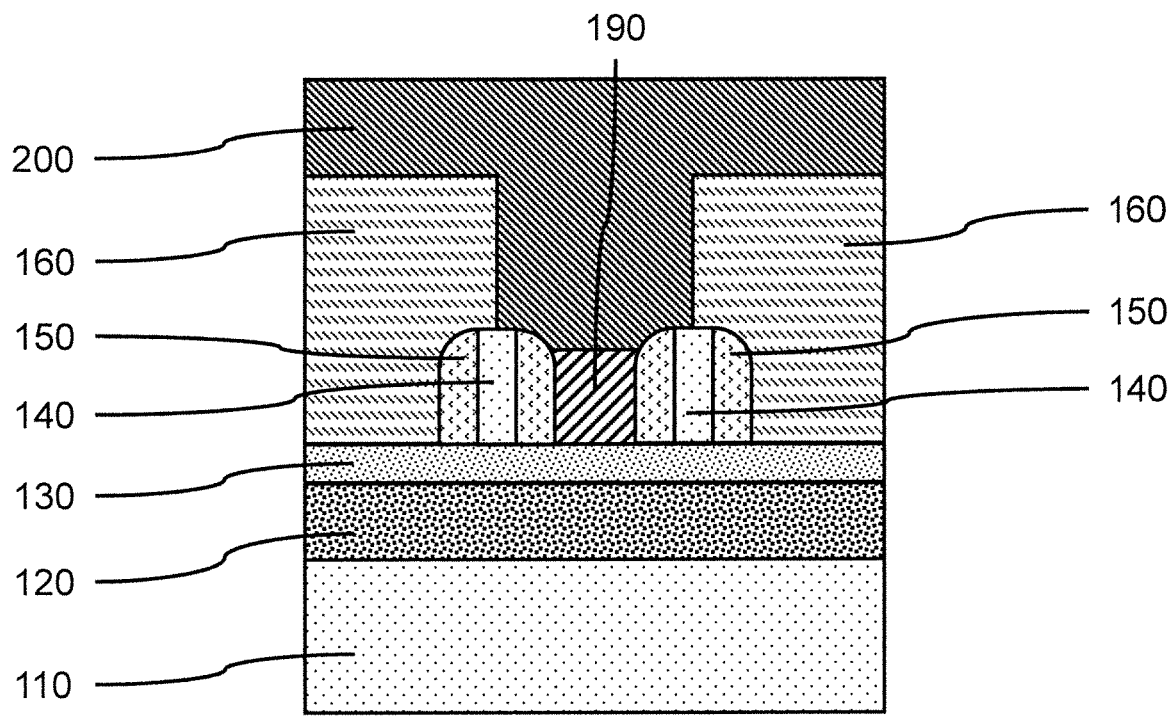
FIG. 10 is a cross-sectional side view along the A-A and A'-A' cross-sections showing a fill layer formed in the opening and over the spacer plugs, in accordance with an embodiment of the present invention.

FIG. 10 is a cross-sectional side view along the A-A and A'-A' cross-sections showing a fill layer formed in the opening and over the spacer plugs, in accordance with an embodiment of the present invention.

In one or more embodiments, the anti-reflection coating layer 170 can be removed from the planarization layer 160 using a selective isotropic (e.g., wet chemical) or directional (e.g., RIE) etch either before or after the formation of fill layer 200.

In one or more embodiments, a fill layer 200 can be formed on the planarization layer 160, in the opening(s) 165, and over the spacer plugs 190, where the fill layer can be formed by a spin-coating or non-conformal deposition (e.g., flowable oxide, CVD plus reflow process) to avoid forming a pinch-off and void space in the opening 165. The fill layer 200 can cover the spacer plugs 190 remaining at the bottom of the opening(s) 165.

In various embodiments, the fill layer 200 can be a dielectric material, including, but not limited to, silicon oxide (SiO), low-k dielectric materials, and combinations thereof. In various embodiments, the fill layer 200 can be a spin-on glass (SOG) and/or a low temperature flowable oxide by CVD. The fill layer 200 can be a dielectric material that is selectively etchable relative to the spacer layer 180, and can be the same material as the sidewall spacers 150.

Figure 11:
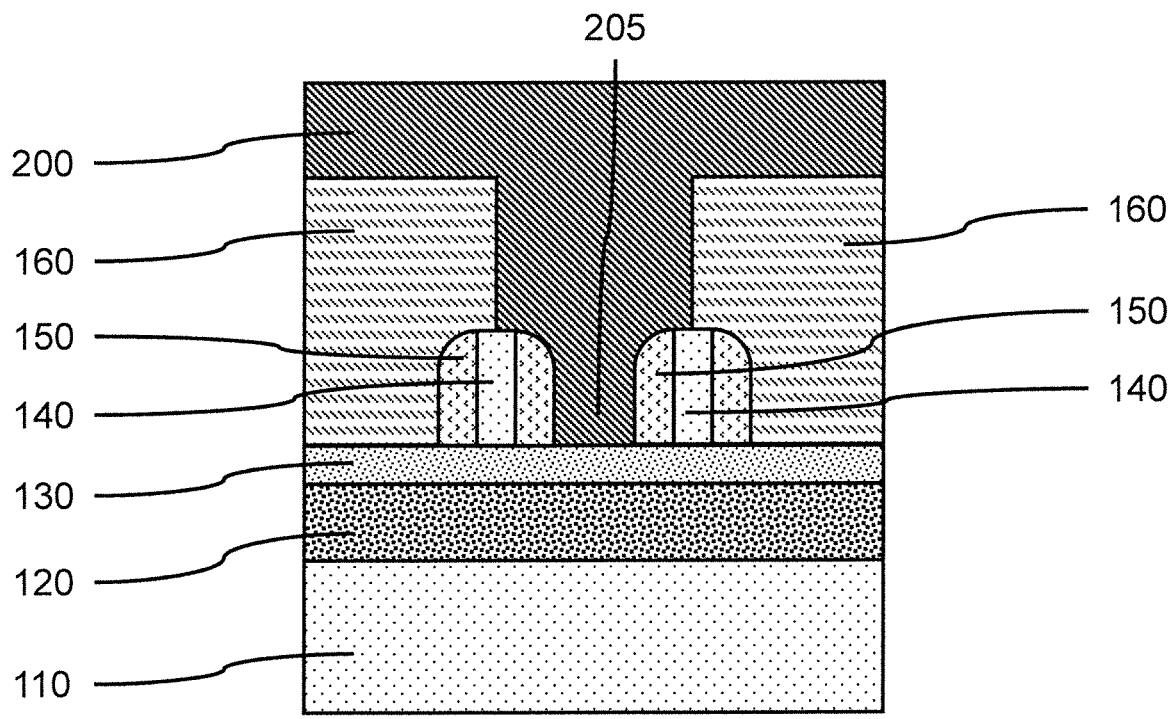
FIG. 11 is a cross-sectional side view along the B-B and B'-B' cross-sections showing the fill layer formed on the planarization layer, in the opening, and between the sidewall spacers, in accordance with an embodiment of the present invention.

FIG. 11 is a cross-sectional side view along the B-B and B'-B' cross-sections showing the fill layer formed on the planarization layer, in the opening, and between the sidewall spacers, in accordance with an embodiment of the present invention.

In one or more embodiments, the fill layer 200 can fill in the central portion of the opening 165 between the sections of the sidewall spacers 150 not covered by the spacer plugs 190. The fill layer 200 can cover the exposed portions of the hardmask layer 130. In a small opening 165, the fill layer can be formed on the spacer plug 190, rather than filling in the central portion of the opening.

Figure 12:
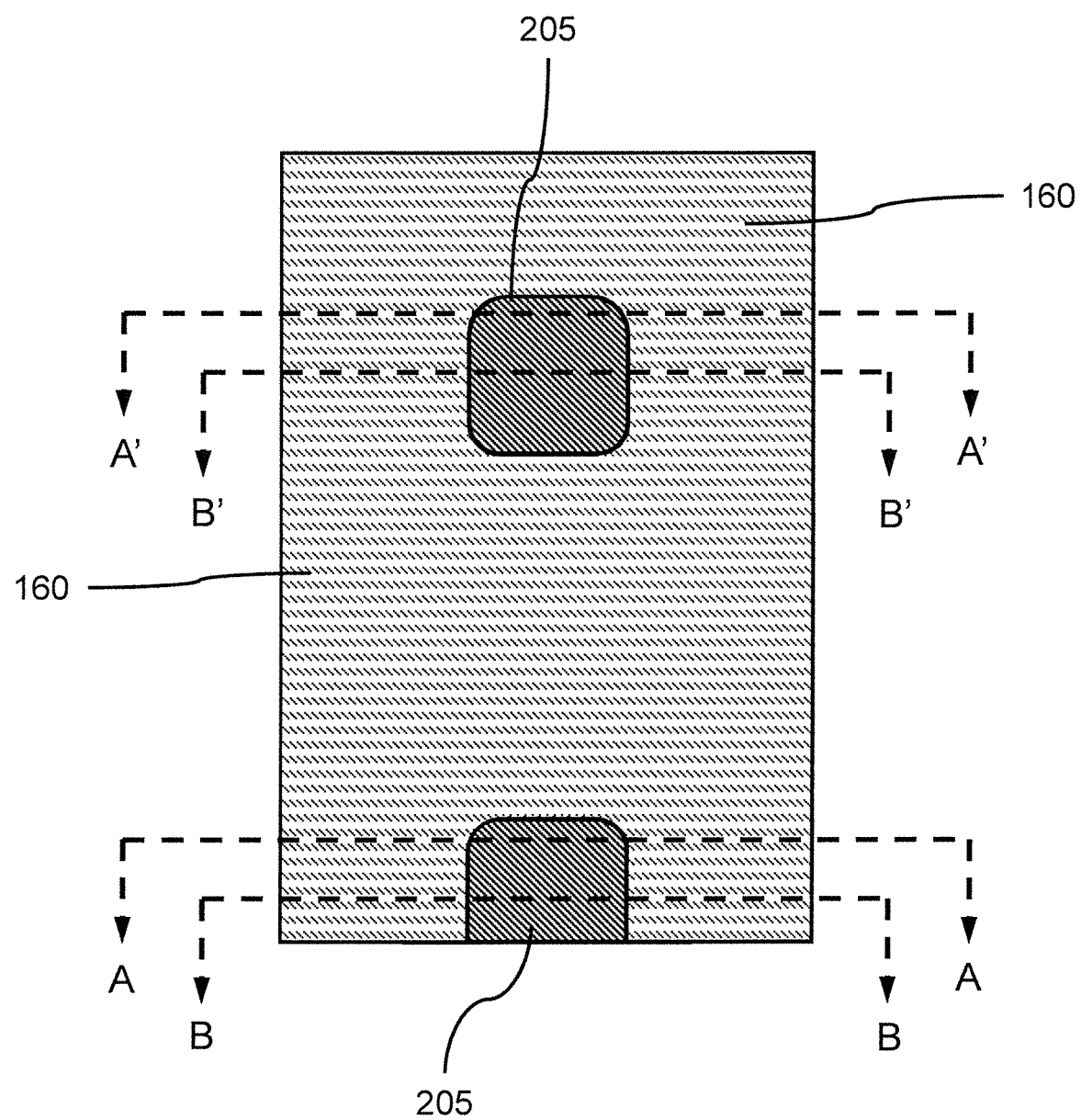
FIG. 12 is a top view showing a plurality of fill layer plugs in the openings, in accordance with an embodiment of the present invention.

FIG. 12 is a top view showing a plurality of fill layer plugs in the openings, in accordance with an embodiment of the present invention.

In one or more embodiments, a plurality of spacer plugs 190 and fill layer plugs 205 can be formed along a length of the mandrels 140 and sidewall spacers 150, where the spacer plugs 190 and fill layer plugs 205 can be formed in the openings 165 positioned at locations where metal line cuts and vias are to be formed from the metallization layer 120. The spacer plugs 190 can define the locations of vias at the end of a metal line, and the fill layer plugs 205 can define the location of the metal line cut. The edges of the spacer plugs 190 can also define the edge of a metal line cut, and the edges of the fill layer plugs 205 can define the gap between the metal lines after the cut. A single spacer plug 190 formed in a small opening 165 can define the location of a via away from the metal line ends.

Figure 13:
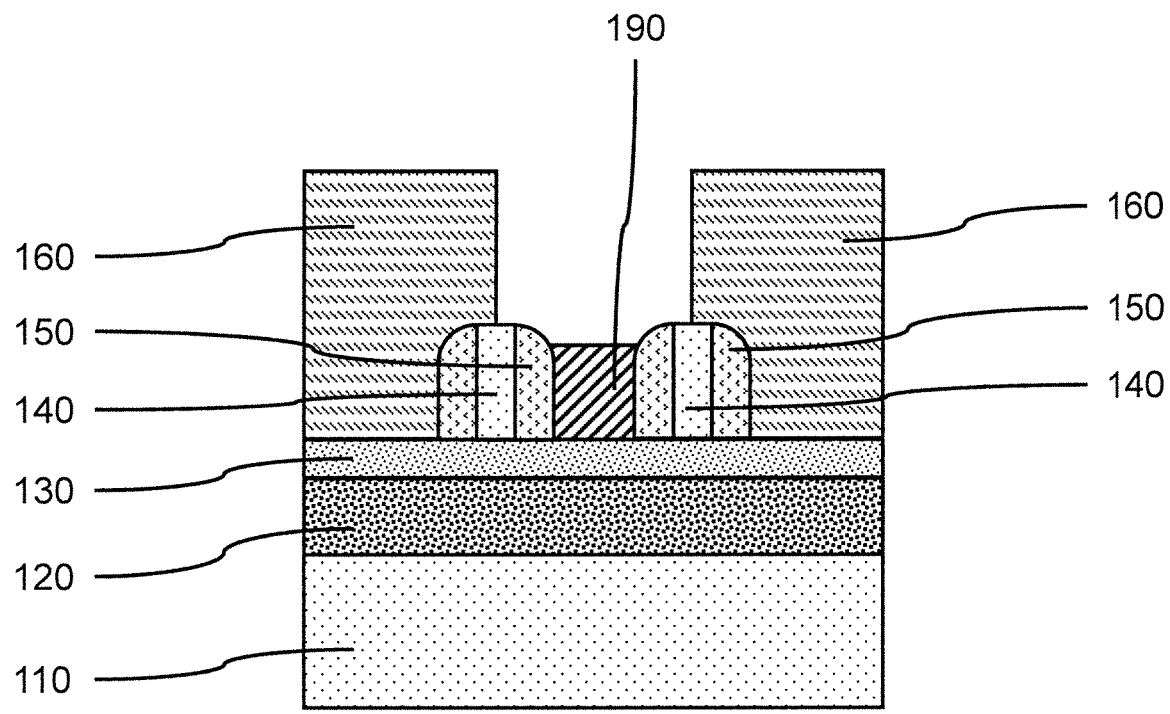
FIG. 13 is a cross-sectional side view along the A-A and A'-A' cross-sections showing a portion of the fill layer removed from the planarization layer and the opening to form a fill layer plug in between the spacer plugs, in accordance with an embodiment of the present invention.

FIG. 13 is a cross-sectional side view along the A-A and A'-A' cross-sections showing a portion of the fill layer removed from the planarization layer and the opening to form a fill layer plug in between the spacer plugs, in accordance with an embodiment of the present invention.

In one or more embodiments, a portion of the fill layer 200 can be removed to form fill layer plugs 205 that cover a portion of the spacer plugs in the opening and fills in the central portion of the opening 165. The fill layer 200 can be reduced to a height that is below the top surface of the planarization layer 160, and at the same height or below the top surface of the spacer plugs 190, for example, using a selective, directional etch (e.g., RIE). In various embodiments, the fill layer 200 and sidewall spacers 150 can be recessed below the top surface of the mandrels 140 by the directional etch. The spacer plugs 190 can cover a portion of the curved surfaces of the sidewall spacers 150. In various embodiments, the fill layer 200 can be reduced to a height that is below the top surface of the planarization layer 160, but above the top surface of the spacer plugs 190.

Figure 14:
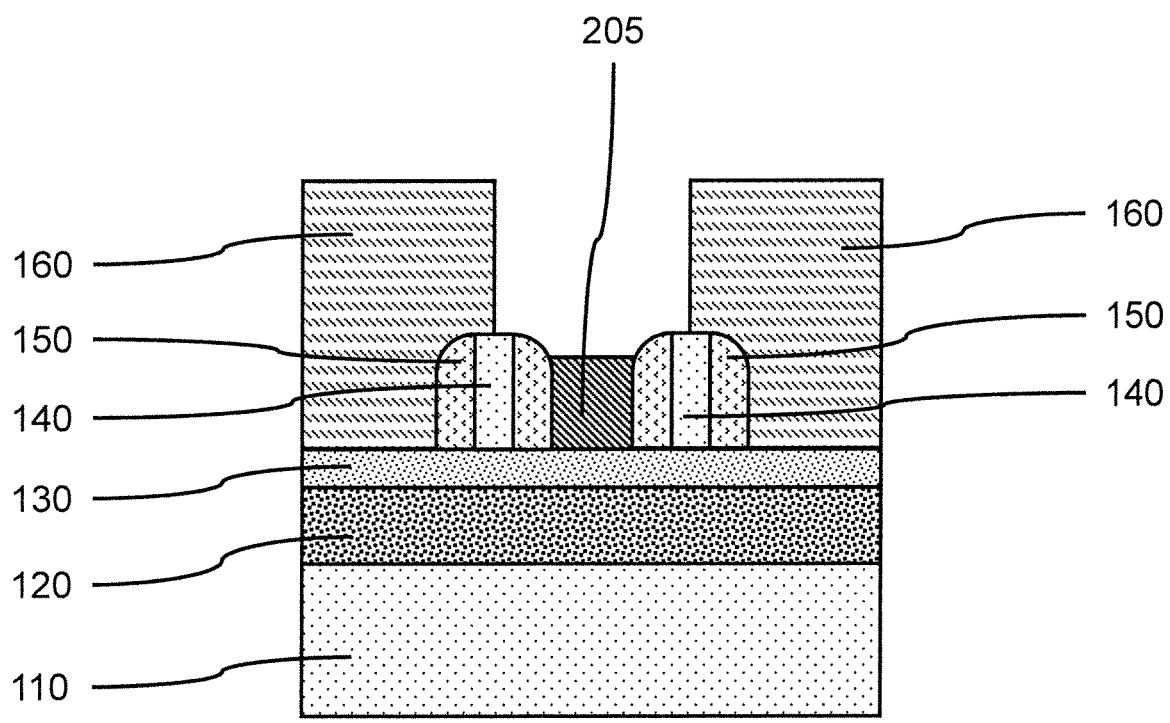
FIG. 14 is a cross-sectional side view along the B-B and B'-B' cross-sections showing a portion of the fill layer removed from the planarization layer and the opening to form a fill layer plug between the sidewall spacers, in accordance with an embodiment of the present invention.

FIG. 14 is a cross-sectional side view along the B-B and B'-B' cross-sections showing a portion of the fill layer removed from the planarization layer and the opening to form a fill layer plug between the sidewall spacers, in accordance with an embodiment of the present invention.

In one or more embodiments, a portion of the fill layer plug 205 can cover the hardmask layer 130 in the central portion of the opening 165 between the adjacent sidewall spacers 150. The fill layer plug 205 can fill in the entire width of the opening 165 above the mandrels 140 and sidewall spacers 150. The fill layer plugs 205 can cover a portion of the curved surface of the sidewall spacers 150 or even the mandrels 140.

Figure 15:
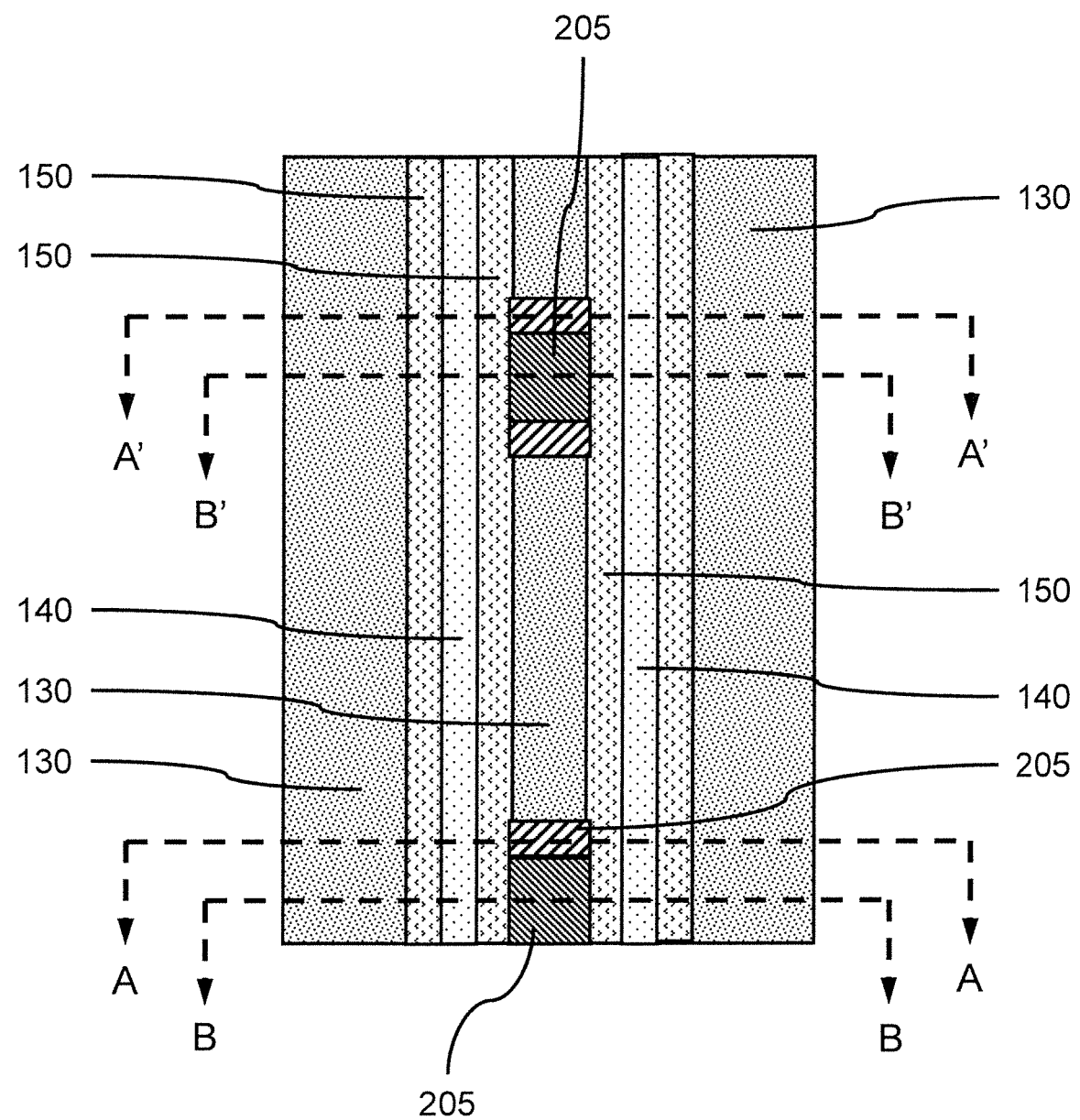
FIG. 15 is a top view showing the planarization layer removed to expose the pair of parallel mandrels and sidewall spacers with the plurality of fill layer plugs between the sidewall spacers, in accordance with an embodiment of the present invention.

FIG. 15 is a top view showing the planarization layer removed to expose the pair of parallel mandrels and sidewall spacers with the plurality of fill layer plugs between the sidewall spacers, in accordance with an embodiment of the present invention.

In one or more embodiments, the planarization layer 160 can be removed using, for example, a selective isotropic etch (e.g., a wet chemical etch or dry plasma etch). Removal of the planarization layer 160 can expose the underlying portions of the mandrels 140 and sidewall spacers 150, and the hardmask layer 130. Portions of the hardmask layer 130 can be exposed between fill layer plugs 205 along the same gap between the adjacent sidewall spacers 150.

Figure 16:
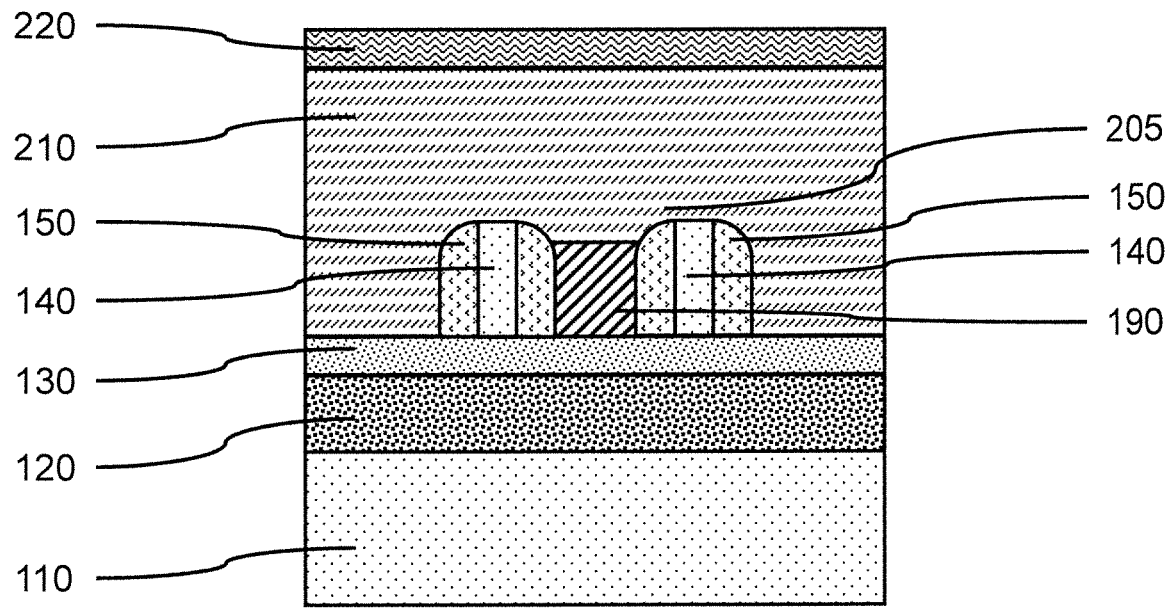
FIG. 16 is a cross-sectional side view showing a second planarization layer formed on the fill layer plugs, spacer plugs, mandrels, and sidewalls spacers, a second ant-reflection coating formed on the second planarization layer, and a plurality of openings formed in the second anti-reflection coating and second planarization layer above a different section of a mandrel and sidewall spacer, in accordance with an embodiment of the present invention.

FIG. 16 is a cross-sectional side view showing a second planarization layer formed on the fill layer plugs, spacer plugs, mandrels, and sidewalls spacers, a second ant-reflection coating formed on the second planarization layer, and a plurality of openings formed in the second anti-reflection coating and second planarization layer above a different section of a mandrel and sidewall spacer, in accordance with an embodiment of the present invention.

In one or more embodiments, a second planarization layer 210 can be formed on the spacer plugs 190, fill layer plugs 205, mandrels 140, and sidewalls spacers 150, where the second planarization layer 210 can be formed by a spin coating, blanket deposition (e.g., CVD, PECVD, PVD, etc.), or combination thereof.

In one or more embodiments, a second anti-reflection coating 220 can be formed on the second planarization layer, where the second anti-reflection coating 220 can be formed by a conformal deposition (e.g., ALD, PEALD), a blanket deposition (e.g., CVD, PECVD, PVD, etc.), or a spin-coating.

In various embodiments, second anti-reflection coating 220 can have a thickness in a range of about 3 nm to about 10 nm, or about 5 nm, although other thicknesses are also contemplated. The thickness of second anti-reflection coating 220 can be thinner than the 1st ARC layer 170, since the removal process of 220 might damage/reduce the height of the exposed portions of sidewall spacers 150.

Figure 17:
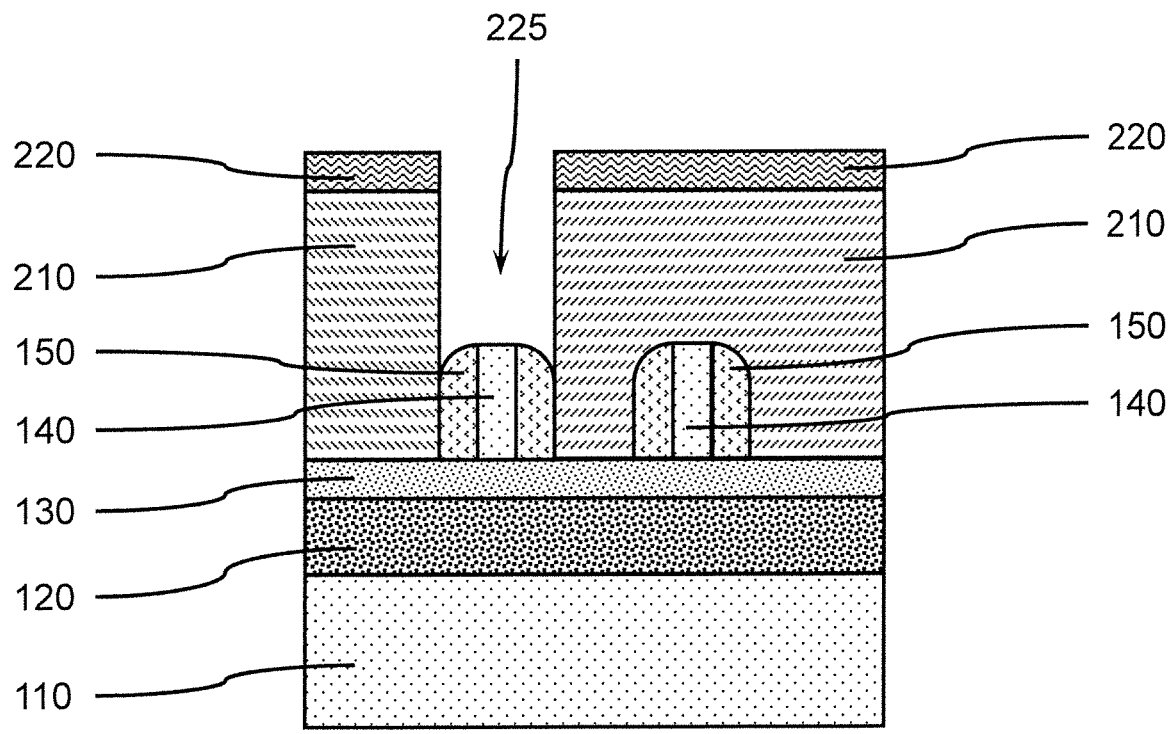
FIG. 17 is a cross-sectional side view showing an opening formed through the second ant-reflection coating and second planarization layer, in accordance with an embodiment of the present invention

FIG. 17 is a cross-sectional side view showing an opening formed through the second ant-reflection coating and second planarization layer, in accordance with an embodiment of the present invention.

In one or more embodiments, a second set of openings 225 can be formed through the second ant-reflection coating 220 and second planarization layer 210, where the second set of openings 225 can be laterally offset from openings 165. The second set of openings 225 can be positioned over a single mandrel 140 and associated pair of sidewall spacers 150 and partial of the gap between the adjacent 150 spacer. But the etch depth of 210 can be less than the full height of 210, such that only the top of mandrels 140 and sidewalls spacers 150 will be exposed, but none of 130 will be exposed. A segment of the mandrel 140 and of each of the sidewall spacers 150 can be exposed by the opening(s) 225. The opening(s) 225 can be formed by masking, lithographic techniques, and etching.

Figure 18:
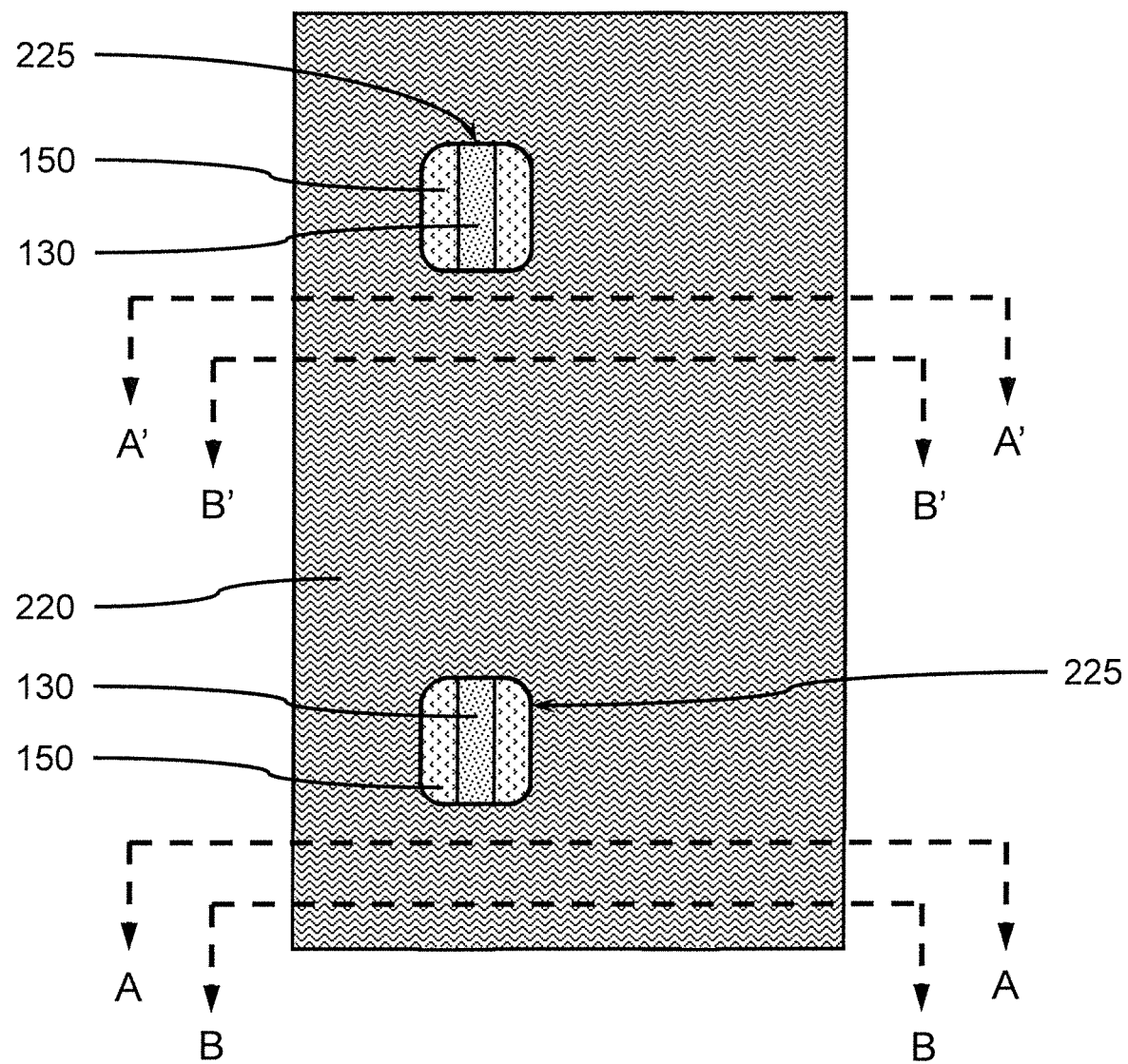
FIG. 18 is a top view showing a plurality of openings formed in the second anti-reflection coating and second planarization layer above a different section of a mandrel and sidewall spacers from the first set of openings, in accordance with an embodiment of the present invention.

FIG. 18 is a top view showing a plurality of openings formed in the second anti-reflection coating and second planarization layer above a different section of a mandrel and sidewall spacers from the first set of openings, in accordance with an embodiment of the present invention.

In one or more embodiments, the second set of openings 225 can be laterally offset from the first set of openings 165, such that segment(s) of a single mandrel 140 and associated pair of sidewall spacers 150 are exposed by the opening 225.

In one or more embodiments, the exposed segment(s) of the mandrel 140 can be removed using a selective directional etch to expose the underlying hardmask layer 130, while leaving the portions of the mandrel 140 covered by the second ant-reflection coating 220 and second planarization layer 210. The edges of the openings 225 can define the segment(s) of the mandrel 140 exposed and removed. The exposed segments of the sidewall spacers 150 can remain after the selective etch.

In one or more embodiments, second spacer plugs 230 and second fill layer plugs 245 can be formed in the second set of openings 225, as described for the first set of openings 165.

Figure 19:
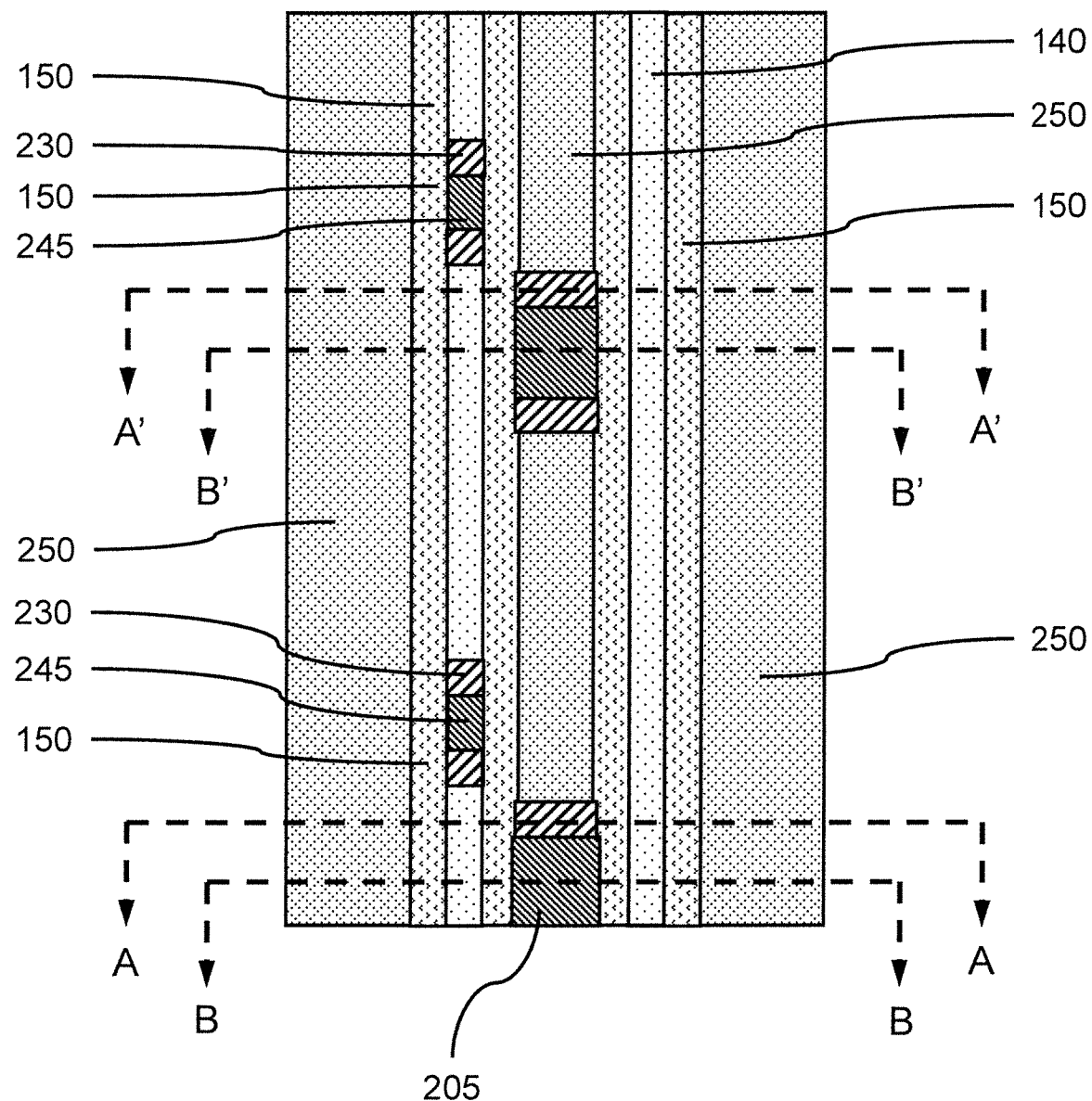
FIG. 19 is a top view showing the second planarization layer and the second ant-reflection coating removed to expose the first fill layer plugs over the first spacer plugs and second fill layer plugs over second spacer plugs, and blocking bars formed adjacent to the sidewalls spacers on the mandrels, in accordance with an embodiment of the present invention.

FIG. 19 is a top view showing the second planarization layer and the second ant-reflection coating removed to expose the first fill layer plugs over the first spacer plugs and second fill layer plugs over second spacer plugs, and blocking bars formed adjacent to the sidewalls spacers on the mandrels, in accordance with an embodiment of the present invention.

In one or more embodiments, the second planarization layer 210 and the second ant-reflection coating 220 can be removed to expose the first fill layer plugs 205 and the first spacer plugs 190, and second fill layer plugs 245 and second spacer plugs 230. The second planarization layer 210 and the second ant-reflection coating 220 can be removed using a selective, isotropic etch (e.g., wet chemical etch or plasma etch).

In one or more embodiments, blocking bars 250 can be formed adjacent to the sidewalls spacers 150 on the remaining portions of the mandrels 140, where the blocking bars 250 can be formed by a spin coating or blanket deposition and etch-back to expose the mandrels 140, sidewalls spacers 150, first fill layer plugs 205 over the first spacer plugs 190, and second fill layer plugs 245 over second spacer plugs 230. The blocking bars 250 can fill in the space of the gap between the first fill layer plugs 205. The blocking bars 250 can cover and protect the underlying hardmask layer 130 for subsequent etching processes.

Figure 20:
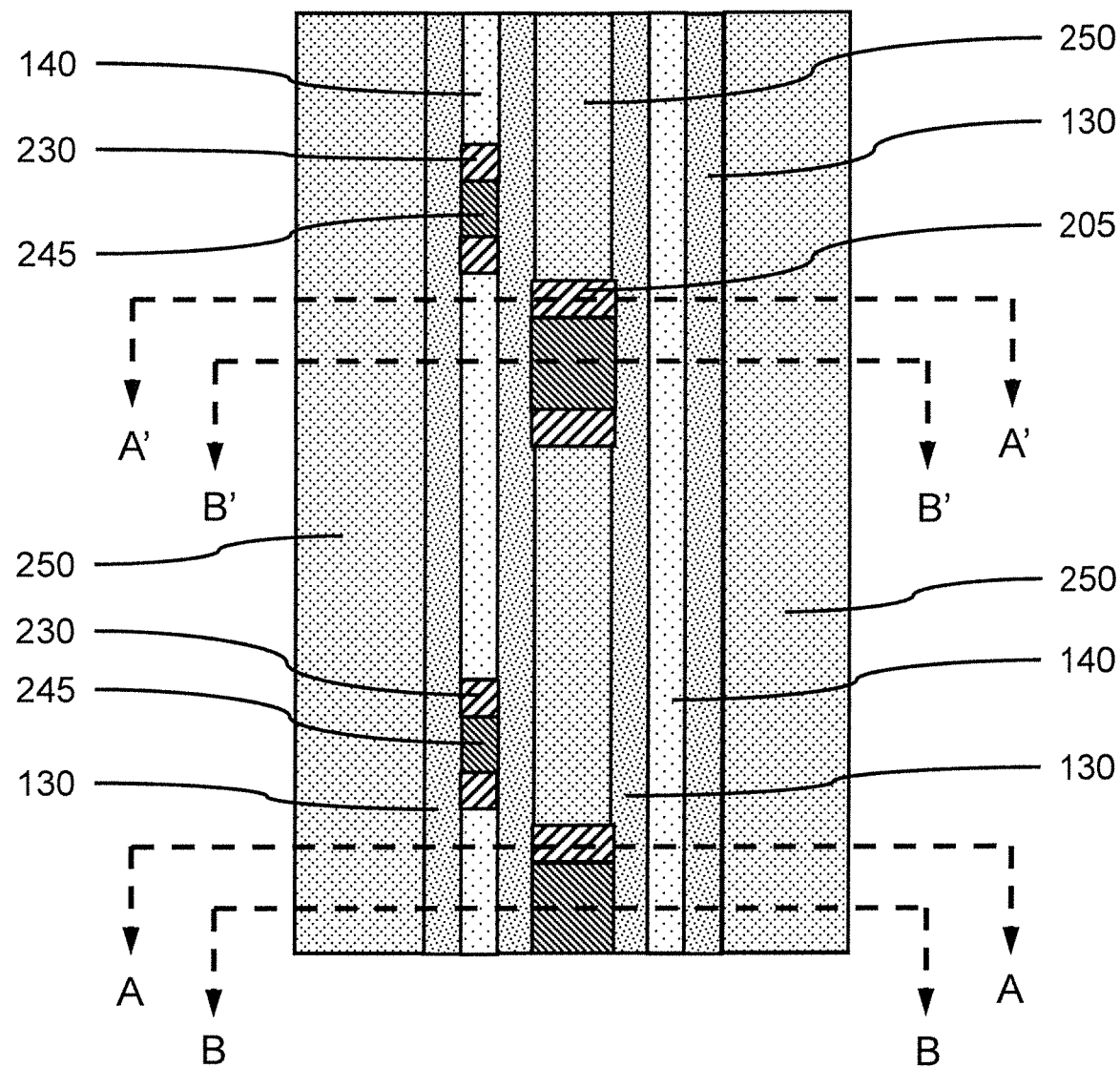
FIG. 20 is a top view showing the sidewall spacers removed to expose the mandrels, first fill layer plugs, and second fill layer plugs, in accordance with an embodiment of the present invention.

FIG. 20 is a top view showing the sidewall spacers removed to expose the mandrels, first fill layer plugs, and second fill layer plugs, in accordance with an embodiment of the present invention.

In one or more embodiments, the sidewall spacers 150 can be removed to expose the mandrels 140, first fill layer plugs 205, and second fill layer plugs 245, and underlying hardmask layer 130, where the sidewall spacers 150 can be removed using a selective isotropic etch. In various embodiments, the first fill layer plugs 205 and second fill layer plugs 245 can be removed at this time, where the first fill layer plugs 205 and second fill layer plugs 245 are the same material as sidewall spacers 150 In various embodiments, the second fill layer plugs 245 and second spacer plugs 230 can remain free-standing on the hardmask layer 130 where second fill layer plugs 245 and second spacer plugs 230 are a different material from sidewall spacers 150.

Figure 21:
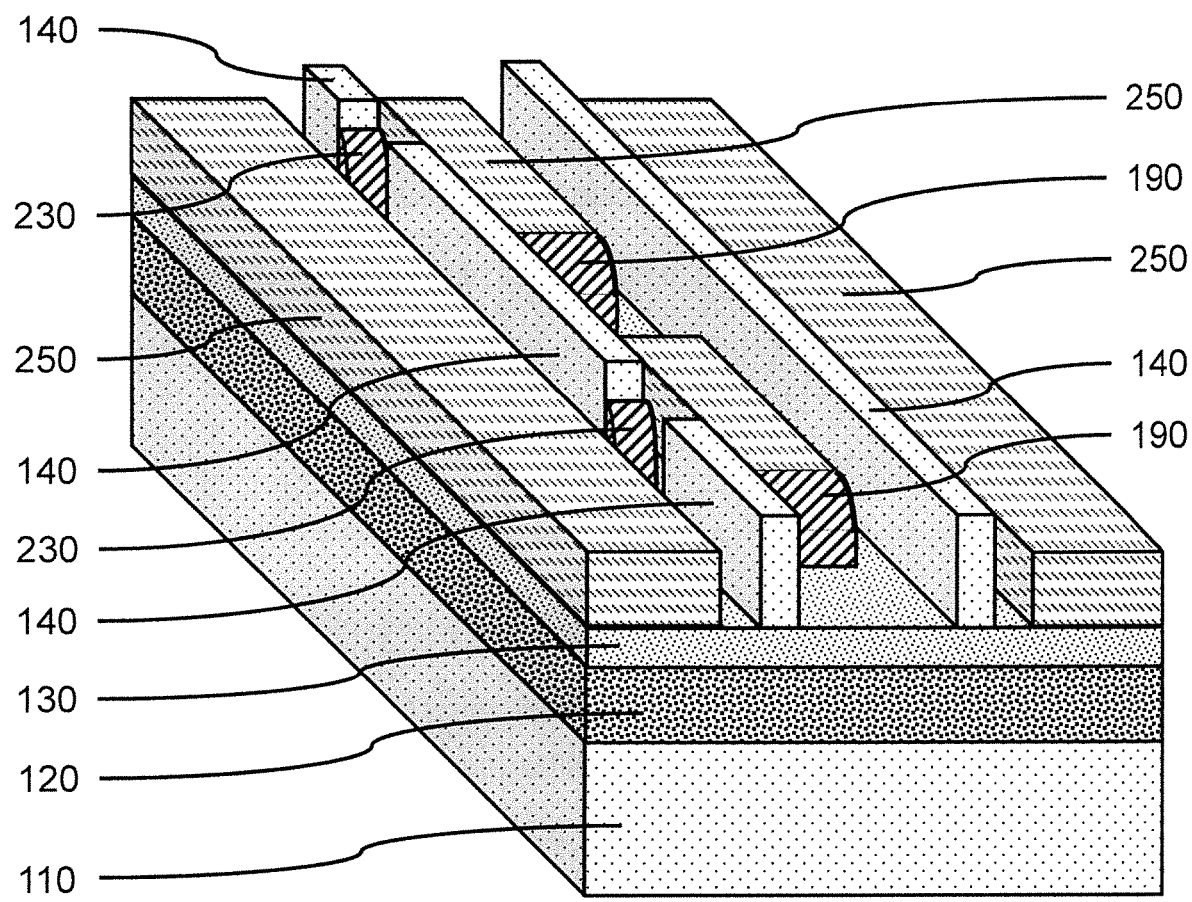
FIG. 21 is an orthographic view showing the spacer plugs, blocking bars, and mandrels exposed after removing the sidewall spacers, first fill layer plugs, and second fill layer plugs, in accordance with an embodiment of the present invention.

FIG. 21 is an orthographic view showing the spacer plugs, blocking bars, and mandrels exposed after removing the sidewall spacers, first fill layer plugs, and second fill layer plugs, in accordance with an embodiment of the present invention.

In one or more embodiments, the second fill layer plugs 245 and first fill layer plugs 205 can be removed using a selective, isotropic etch to expose the underlying second spacer plugs 230, first spacer plugs 190, and underlying hardmask layer 130. There can be parallel channels between the blocking bars 250 and mandrels 140 after removing the sidewall spacers 150, where the hardmask layer 130 is exposed. There can also be spaces between the first spacer plugs 190, where the hardmask layer 130 is exposed, and spaces between the second spacer plugs 230, where the hardmask layer 130 is exposed.

In various embodiments, the first spacer plugs 190 and second spacer plugs 230 have curved surfaces forming an arch, which is exposed after removing the second fill layer plugs 245 and first fill layer plugs 205.

Figure 22:
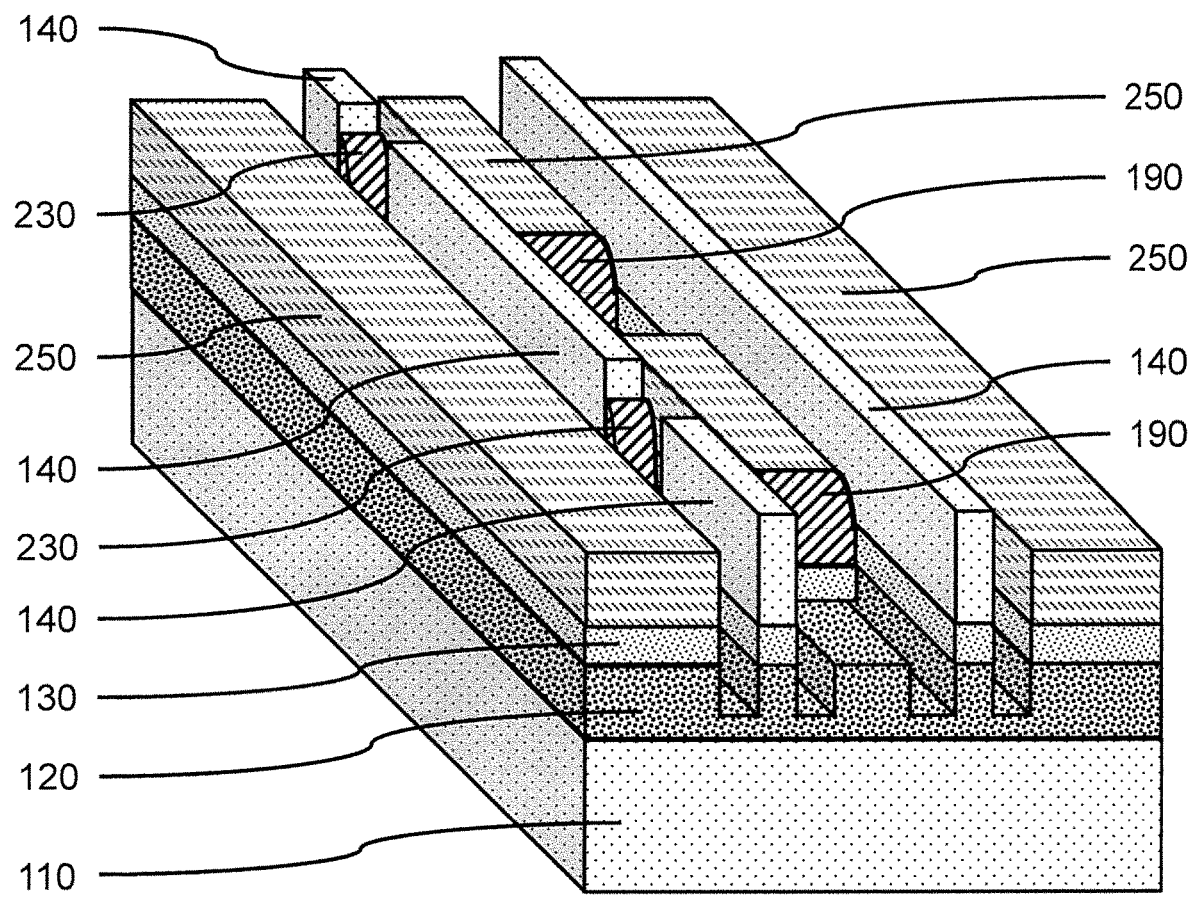
FIG. 22 is an orthographic view showing trenches formed in the substrate, in accordance with an embodiment of the present invention.

FIG. 22 is an orthographic view showing trenches formed in the substrate, in accordance with an embodiment of the present invention.

In one or more embodiments, the blocking bars 250, mandrels 140, first spacer plugs 190, and second spacer plugs 230, can be used as masks for removing exposed portions of the hardmask layer 130 and underlying metallization layer 120. One or more selective, directional etches (e.g., RIE), can be used to extend the channels down through the hardmask layer 130 and into the metallization layer 120, where exposed portions of metallization layer 120 can be partially or entirely removed. In various embodiments, the channels do not extend through the metallization layer 120 to the substrate 110. A thickness of the metallization layer 120 can remain between the bottom of the channels and the top surface of the substrate 110. The height can be less than the height of the vias. In various embodiments, the channels extend through the metallization layer 120 to the substrate 110.

In various embodiments, the remaining thickness of the metallization layer 120 can be in the range of about 1 nm to about 50 nm, or about 15 nm to about 35 nm, although other thicknesses are also contemplated. In the final structure in FIG. 24, Height_120=Height of metal line 122+Height of via 125. So the remaining thickness of metallization layer 120 can be <=Height of via 125.

Figure 23:
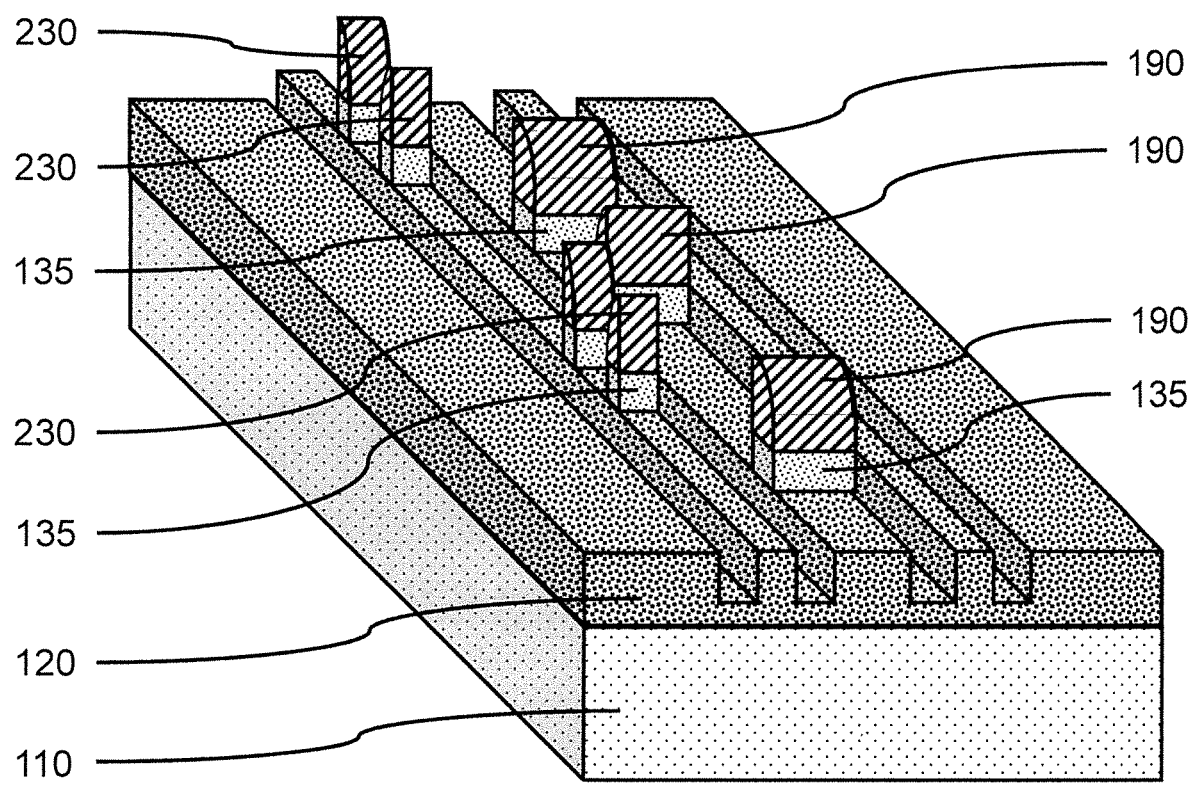
FIG. 23 is an orthographic view showing the blocking bars, mandrels, and exposed portions of the hardmask layer removed, in accordance with an embodiment of the present invention.

FIG. 23 is an orthographic view showing the blocking bars, mandrels, and exposed portions of the hardmask layer removed, in accordance with an embodiment of the present invention.

In one or more embodiments, the blocking bars 250, mandrels 140, and exposed portions of the hardmask layer 130 can be removed using selective plasma or wet etching to expose the underlying metallization layer 120. The first spacer plugs 190 and second spacer plugs 230 can remain on hardmask pedestals 135 formed by removing the exposed portions of the hardmask layer 130.

Figure 24:
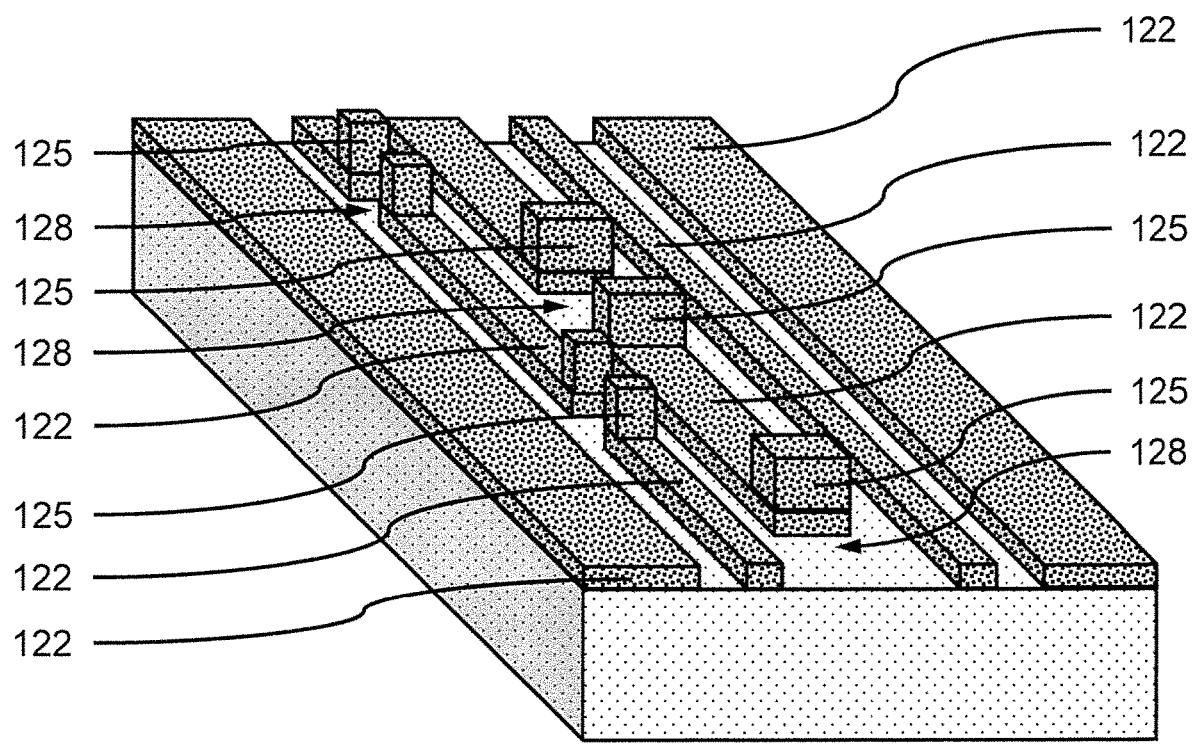
FIG. 24 is an orthographic view showing the self-aligned vias, metal lines, and line cuts, in accordance with an embodiment of the present invention.

FIG. 24 is an orthographic view showing the self-aligned vias, metal lines, and line cuts, in accordance with an embodiment of the present invention.

In one or more embodiments, the exposed portions of the metallization layer 120 can be further removed using a selective, directional etch to form the self-aligned vias 125 integral with the underlying metal lines 122 and with line cuts 128 at the end of select metal lines, as determined by the previous lithography and etching processes and thickness of the metallization layer 120. In another embodiment, the full height of metal layer 120 can be removed, such that the remaining layer thickness equals 0, this directional recess etch determines height of the via 125 and the height of the metal line 122.

In various embodiments, the integral self-aligned vias 125 can share common sidewalls and a common end wall with the underlying metal line 122 at a line cut, and a single via along the length of the underlying metal line 122 can share common sidewalls.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a self-aligned top via, comprising:
   forming a metallization layer on a substrate;
   forming a hardmask layer on the metallization layer;
   forming a pair of adjacent parallel mandrels on the hardmask layer with sidewall spacers on opposite sides of each mandrel;
   forming a planarization layer on the exposed portions of the hardmask layer, mandrels, and sidewall spacers;
   forming an opening in the planarization layer aligned between the adjacent parallel mandrels;
   forming a spacer layer in the opening; and
   removing portions of the spacer layer to form a pair of spacer plugs between sections of the sidewall spacers.

2. The method of claim 1, further comprising forming a fill layer in the opening over and between the pair of spacer plugs.

3. The method of claim 2, further comprising removing a portion of the fill layer to expose the pair of spacer plugs and form a fill layer plug between the pair of spacer plugs.

4. The method of claim 3, further comprising removing the planarization layer, and forming a second planarization layer on the spacer plugs, fill layer plugs, mandrels, and sidewalls spacers.

5. The method of claim 4, further comprising forming a second opening through the second planarization layer, wherein the second opening is positioned over one of the pair of adjacent parallel mandrels and the sidewall spacers on opposite sides of the one mandrel.

6. The method of claim 5, further comprising removing the portion of the one mandrel exposed by the second opening.

7. The method of claim 6, further comprising forming a pair of second spacer plugs and a second fill layer plug between the sidewall spacers in the second opening.

8. The method of claim 6, further comprising forming blocking bars adjacent to each of the sidewalls spacers.

9. The method of claim 8, further comprising removing portions of the hardmask layer and metallization layer to form integral self-aligned vias and metal lines on the substrate.

10. A method of forming a self-aligned top via, comprising:
    forming a hardmask layer on the metallization layer over a substrate;
    forming a pair of adjacent parallel mandrels on the hardmask layer with sidewall spacers on opposite sides of each mandrel;
    forming a planarization layer on the exposed portions of the hardmask layer, mandrels, and sidewall spacers;
    forming an opening in the planarization layer aligned between the adjacent parallel mandrels;
    forming a spacer layer in the opening;
    removing portions of the spacer layer to form a pair of spacer plugs between sections of the sidewall spacers; and
    forming a fill layer in the opening over and between the pair of spacer plugs.

11. The method of claim 10, wherein the opening has a width in a range of about 10 nm to about 60 nm.

12. The method of claim 10, wherein the opening has a width of about a gap distance, $D_G$, between facing adjacent sidewall spacers on different adjacent parallel mandrels.

13. The method of claim 10, wherein the spacer layer is a hardmask material selected from the group consisting of titanium nitride (TiN), tantalum nitride (TaN), silicon nitride (SiN), silicon oxynitride (SiON), silicon boro carbonitride (SiBCN), and combinations thereof.

14. The method of claim 13, wherein the fill layer is a dielectric material selected from the group consisting of silicon oxide (SiO), low-k dielectric materials, and combinations thereof.

15. The method of claim 14, further comprising removing a portion of the fill layer to expose the pair of spacer plugs and form a fill layer plug between the pair of spacer plugs.

16. The method of claim 15, further comprising removing the planarization layer, and forming a second planarization layer on the spacer plugs, fill layer plugs, mandrels, and sidewalls spacers.

* * * * *